(12) United States Patent
Luo et al.

(10) Patent No.: US 12,406,728 B2
(45) Date of Patent: Sep. 2, 2025

(54) METHODS OF FORMING MICROELECTRONIC DEVICES, AND RELATED MICROELECTRONIC DEVICES, MEMORY DEVICES, AND ELECTRONIC SYSTEMS

(71) Applicant: Micron Technology, Inc., Boise, ID (US)

(72) Inventors: Shuangqiang Luo, Boise, ID (US); John D. Hopkins, Meridian, ID (US); Jiewei Chen, Meridian, ID (US); Jordan D. Greenlee, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 713 days.

(21) Appl. No.: 17/654,311

(22) Filed: Mar. 10, 2022

(65) Prior Publication Data
US 2023/0290409 A1 Sep. 14, 2023

(51) Int. Cl.
| | | |
|---|---|---|
| G11C 16/04 | (2006.01) | |
| H01L 21/768 | (2006.01) | |
| H10B 41/27 | (2023.01) | |
| H10B 41/35 | (2023.01) | |
| H10B 43/27 | (2023.01) | |
| H10B 43/35 | (2023.01) | |

(52) U.S. Cl.
CPC .... *G11C 16/0483* (2013.01); *H01L 21/76843* (2013.01); *H10B 41/27* (2023.02); *H10B 41/35* (2023.02); *H10B 43/27* (2023.02); *H10B 43/35* (2023.02)

(58) Field of Classification Search
CPC .......... G11C 16/0483; H01L 21/76843; H10B 41/27; H10B 41/35; H10B 43/27; H10B 43/35; H10B 41/50; H10B 43/50
See application file for complete search history.

(56) References Cited

U.S. PATENT DOCUMENTS

| | | | |
|---|---|---|---|
| 2019/0206727 A1* | 7/2019 | Matovu | H01L 23/5226 |
| 2021/0098483 A1* | 4/2021 | Kang | H10B 43/10 |
| 2022/0199637 A1* | 6/2022 | Luo | H10B 43/50 |

* cited by examiner

*Primary Examiner* — Ratisha Mehta
*Assistant Examiner* — Sophia W Kao
(74) *Attorney, Agent, or Firm* — TraskBritt

(57) ABSTRACT

A microelectronic device includes a stack structure, slot structures, and dielectric material. The stack structure includes blocks each including a vertically alternating sequence of conductive material and insulative material arranged in tiers. At least one of the blocks includes an array region including strings of memory cells, and a staircase region including a crest sub-region interposed between a staircase structure and the array region. An uppermost boundary of the tiers within the crest sub-region underlies an uppermost boundary of the tiers within the array region. The slot structures are interposed between the blocks of the stack structure. The dielectric material extends over and between the blocks of the stack structure. A thickness of a portion of the dielectric material overlying the crest sub-region is greater than a thickness of an additional portion of the dielectric material overlying the array region. Related memory devices, electronic systems, and methods are also described.

28 Claims, 17 Drawing Sheets

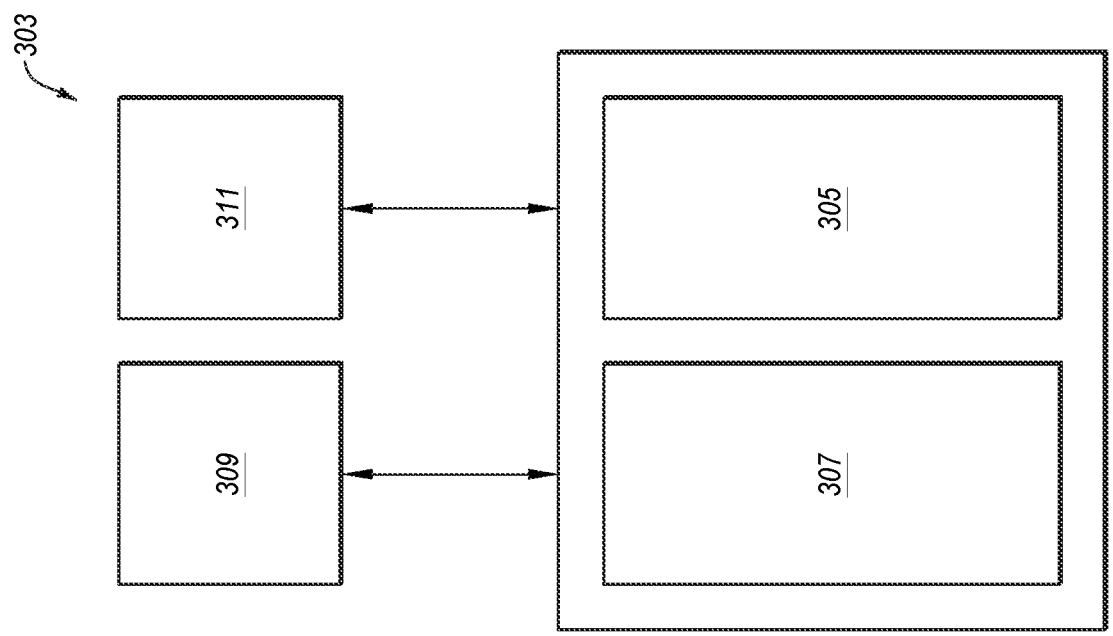

METHODS OF FORMING MICROELECTRONIC DEVICES, AND RELATED MICROELECTRONIC DEVICES, MEMORY DEVICES, AND ELECTRONIC SYSTEMS

TECHNICAL FIELD

The disclosure, in various embodiments, relates generally to the field of microelectronic device design and fabrication. More specifically, the disclosure relates to methods of forming microelectronic devices including staircase structures, and to related microelectronic devices, memory devices, and electronic systems.

BACKGROUND

Microelectronic device designers often desire to increase the level of integration or density of features within a microelectronic device by reducing the dimensions of the individual features and by reducing the separation distance between neighboring features. In addition, microelectronic device designers often seek to design architectures that are not only compact, but offer performance advantages, as well as simplified designs.

One example of a microelectronic device is a memory device. Memory devices are generally provided as internal integrated circuits in computers or other electronic devices. There are many types of memory devices including, but not limited to, non-volatile memory devices, such as Flash memory devices. A conventional Flash memory device generally includes a memory array having charge storage devices (e.g., memory cells, such as non-volatile memory cells) arranged in rows and columns. In a NAND architecture type of Flash memory, memory cells arranged in a column are coupled in series, and a first memory cell of the column is coupled to a data line (e.g., a bit line). In a "three-dimensional NAND" memory device (which may also be referred to herein as a "3D NAND" memory device), a type of vertical memory device, not only are the memory cells arranged in row and column fashion in a horizontal array, but tiers of the horizontal arrays are stacked over one another (e.g., as vertical strings of memory cells) to provide a "three-dimensional array" of the memory cells. The stack of tiers vertically alternate conductive materials with insulative (e.g., dielectric) materials. The conductive materials function as control gates for access lines (e.g., word lines) of the memory cells. Vertical structures (e.g., pillars comprising channel structures and tunneling structures) extend along the vertical string of memory cells. A drain end of a string is adjacent one of the top and bottom of the vertical structure, while a source end of the string is adjacent the other of the top and the bottom of the pillar. The drain end is operably connected to a bit line, while the source end is operably connected to a source structure (e.g., a source plate, a source line). A 3D NAND memory device also includes electrical connections between the access lines and other conductive structures of the device so that the memory cells of the vertical strings can be selected for writing, reading, and erasing operations.

Some 3D NAND memory devices include so-called "staircase" structures having "steps" (also referred to as "stairs") at edges (e.g., ends) of the tiers of the stack. The steps have treads (e.g., upper surfaces) defining contact regions of conductive structures of the device, such as of access lines (e.g., local access lines), which may be formed by the conductive materials of the tiered stack. Contact structures may be provided in physical contact with the steps to facilitate electrical access to the conductive structures associated with the steps. The contact structures may be in electrical communication, by way of conductive routing structures, to additional contact structures that communicate to a source/drain region. String drivers drive access line voltages to write to or read from the memory cells controlled via the access lines.

A continued goal in the microelectronic device fabrication industry is to reduce the footprint of the features of microelectronic devices so as to maximize the number of devices, and functional features thereof, in a given structural area. However, as feature packing densities have increased and margins for formation errors have decreased, conventional methods of forming 3D NAND memory devices have resulted in deformations that can diminish desired memory device performance, reliability, and durability. For example, conventional methods of forming the tiered stack of a 3D NAND memory device using so called "replacement gate" or "gate last" processing, wherein sacrificial structures of a preliminary stack structure are at least partially replaced with the conductive structures, can result in deformations (e.g., tier shrinking, tier dishing, tier bending) within staircase regions of the tiered stack. Such deformations can result in undesirable defects, undesirable reliability, and/or undesirable durability in the 3D NAND memory device including the stack structure formed through such conventional methods.

BRIEF DESCRIPTION OF THE DRAWINGS

FIG. 12 is a schematic block diagram illustrating an electronic system, in accordance with embodiments of the disclosure.

DETAILED DESCRIPTION

Figure 1A:
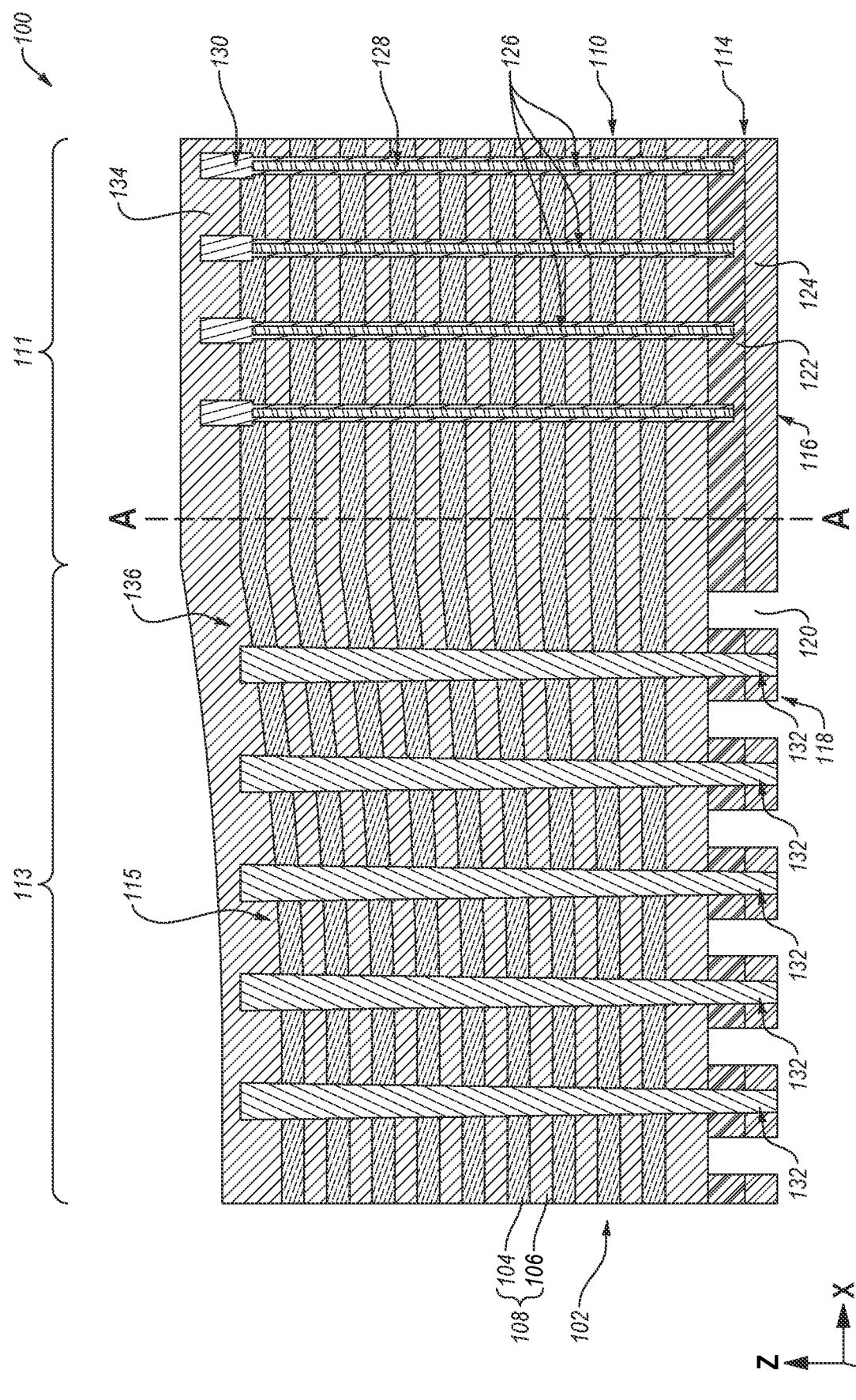
FIG. 1A is a simplified, longitudinal cross-sectional view of a portion of a microelectronic device structure at a processing stage of a method of forming a microelectronic device, in accordance with embodiments of the disclosure.

The following description provides specific details, such as material compositions, shapes, and sizes, in order to provide a thorough description of embodiments of the disclosure. However, a person of ordinary skill in the art would understand that the embodiments of the disclosure may be practiced without employing these specific details. Indeed, the embodiments of the disclosure may be practiced in conjunction with conventional microelectronic device fabrication techniques employed in the industry. In addition, the description provided below does not form a complete process flow for manufacturing a microelectronic device (e.g., a memory device). The structures described below do not form a complete microelectronic device. Only those process acts and structures necessary to understand the embodiments of the disclosure are described in detail below. Additional acts to form a complete microelectronic device from the structures may be performed by conventional fabrication techniques.

Drawings presented herein are for illustrative purposes only and are not meant to be actual views of any particular material, component, structure, device, or system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale. Additionally, elements common between figures may retain the same numerical designation.

As used herein, a "memory device" means and includes microelectronic devices exhibiting memory functionality, but not necessarily limited to memory functionality. Stated another way, and by way of non-limiting example only, the term "memory device" includes not only conventional memory (e.g., conventional non-volatile memory, such as conventional NAND memory; conventional volatile memory, such as conventional dynamic random access memory (DRAM)), but also includes an application specific integrated circuit (ASIC) (e.g., a system on a chip (SoC)), a microelectronic device combining logic and memory, and a graphics processing unit (GPU) incorporating memory.

As used herein, the term "configured" refers to a size, shape, material composition, orientation, and arrangement of one or more of at least one structure and at least one apparatus facilitating operation of one or more of the structure and the apparatus in a pre-determined way.

As used herein, the terms "vertical," "longitudinal," "horizontal," and "lateral" are in reference to a major plane of a structure and are not necessarily defined by earth's gravitational field. A "horizontal" or "lateral" direction is a direction that is substantially parallel to the major plane of the structure, while a "vertical" or "longitudinal" direction is a direction that is substantially perpendicular to the major plane of the structure. The major plane of the structure is defined by a surface of the structure having a relatively large area compared to other surfaces of the structure. With reference to the figures, a "horizontal" or "lateral" direction may be perpendicular to an indicated "Z" axis, and may be parallel to an indicated "X" axis and/or parallel to an indicated "Y" axis; and a "vertical" or "longitudinal" direction may be parallel to an indicated "Z" axis, may be perpendicular to an indicated "X" axis, and may be perpendicular to an indicated "Y" axis.

As used herein, features (e.g., regions, materials, structures, trenches, devices) described as "neighboring" one another means and includes features of the disclosed identity (or identities) that are located most proximate (e.g., closest to) one another. Additional features (e.g., additional regions, additional materials, additional structures, additional trenches, additional devices) not matching the disclosed identity (or identities) of the "neighboring" features may be disposed between the "neighboring" features. Put another way, the "neighboring" features may be positioned directly adjacent one another, such that no other feature intervenes between the "neighboring" features; or the "neighboring" features may be positioned indirectly adjacent one another, such that at least one feature having an identity other than that associated with at least one the "neighboring" features is positioned between the "neighboring" features. Accordingly, features described as "vertically neighboring" one another means and includes features of the disclosed identity (or identities) that are located most vertically proximate (e.g., vertically closest to) one another. Moreover, features described as "horizontally neighboring" one another means and includes features of the disclosed identity (or identities) that are located most horizontally proximate (e.g., horizontally closest to) one another.

As used herein, the term "intersection" means and includes a location at which two or more features (e.g., regions, structures, materials, trenches, devices) or, alternatively, two or more portions of a single feature meet. For example, an intersection between a first feature extending in a first direction (e.g., an X-direction) and a second feature extending in a second direction (e.g., a Y-direction) different than the first direction may be the location at which the first feature and the second feature meet.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the singular forms "a," "an," and "the" are intended to include the plural forms as well, unless the context clearly indicates otherwise.

As used herein, "and/or" includes any and all combinations of one or more of the associated listed items.

As used herein, the phrase "coupled to" refers to structures operatively connected with each other, such as electrically connected through a direct Ohmic connection or through an indirect connection (e.g., by way of another structure).

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, "conductive material" means and includes electrically conductive material such as one or more of a metal (e.g., tungsten (W), titanium (Ti), molybdenum (Mo), niobium (Nb), vanadium (V), hafnium (Hf), tantalum (Ta), chromium (Cr), zirconium (Zr), iron (Fe), ruthenium (Ru), osmium (Os), cobalt (Co), rhodium (Rh), iridium (Ir), nickel (Ni), palladium (Pa), platinum (Pt), copper (Cu), silver (Ag), gold (Au), aluminum (Al)), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a magnesium (Mg)-based alloy, a Ti-based alloy, a steel, a low-carbon steel, a stainless steel), a conductive metal-containing material (e.g., a conductive metal nitride, a conductive metal silicide, a conductive metal carbide, a conductive metal oxide), and a conductively doped semiconductor material (e.g., conductively doped polysilicon, conductively doped germanium (Ge), conductively doped silicon germanium (SiGe)). In addition, a "conductive structure" means and includes a structure formed of and including conductive material.

As used herein, "insulative material" means and includes electrically insulative material, such one or more of at least one dielectric oxide material (e.g., one or more of a silicon oxide ($SiO_x$), phosphosilicate glass, borosilicate glass, borophosphosilicate glass, fluorosilicate glass, an aluminum oxide ($AlO_x$), a hafnium oxide ($HfO_x$), a niobium oxide ($NbO_x$), a titanium oxide ($TiO_x$), a zirconium oxide ($ZrO_x$), a tantalum oxide ($TaO_x$), and a magnesium oxide ($MgO_x$), at least one dielectric nitride material (e.g., a silicon nitride ($SiN_y$)), at least one dielectric oxynitride material (e.g., a silicon oxynitride ($SiO_xN_y$)), and at least one dielectric carboxynitride material (e.g., a silicon carboxynitride ($SiO_xC_zN_y$)). Formulae including one or more of "x," "y," and "z" herein (e.g., $SiO_x$, $AlO_x$, $HfO_x$, $NbO_x$, $TiO_x$, $SiN_y$, $SiO_xN_y$, $SiO_xC_zN_y$) represent a material that contains an average ratio of "x" atoms of one element, "y" atoms of another element, and "z" atoms of an additional element (if any) for every one atom of another element (e.g., Si, Al, Hf, Nb, Ti). As the formulae are representative of relative atomic ratios and not strict chemical structure, an insulative material may comprise one or more stoichiometric compounds and/or one or more non-stoichiometric compounds, and values of "x," "y," and "z" (if any) may be integers or may be non-integers. As used herein, the term "non-stoichiometric compound" means and includes a chemical compound with an elemental composition that cannot be represented by a ratio of well-defined natural numbers and is in violation of the law of definite proportions. In addition, an "insulative structure" means and includes a structure formed of and including insulative material.

As used herein, the term "semiconductor material" refers to a material having an electrical conductivity between those of insulative materials and conductive materials. For example, a semiconductor material may have an electrical conductivity of between about $10^{-8}$ Siemens per centimeter (S/cm) and about $10^4$ S/cm ($10^6$ S/m) at room temperature. Examples of semiconductor materials include elements found in column IV of the periodic table of elements such as silicon (Si), germanium (Ge), and carbon (C). Other examples of semiconductor materials include compound semiconductor materials such as binary compound semiconductor materials (e.g., gallium arsenide (GaAs)), ternary compound semiconductor materials (e.g., $Al_xGa_{1-x}As$), and quaternary compound semiconductor materials (e.g., $Ga_xIn_{1-x}As_yP_{1-y}$), without limitation. Compound semiconductor materials may include combinations of elements from columns III and V of the periodic table of elements semiconductor materials) or from columns II and VI of the periodic table of elements (II-VI semiconductor materials), without limitation. Further examples of semiconductor materials include oxide semiconductor materials such as zinc tin oxide ($Zn_xSn_yO$, commonly referred to as "ZTO"), indium zinc oxide ($In_xZn_yO$, commonly referred to as "IZO"), zinc oxide ($Zn_xO$), indium gallium zinc oxide ($In_xGa_yZn_zO$, commonly referred to as "IGZO"), indium gallium silicon oxide ($In_xGa_ySi_zO$, commonly referred to as "IGSO"), indium tungsten oxide ($In_xW_yO$, commonly referred to as "IWO"), indium oxide ($In_xO$), tin oxide ($Sn_xO$), titanium oxide ($Ti_xO$), zinc oxide nitride ($Zn_xON_z$), magnesium zinc oxide ($Mg_xZn_yO$), zirconium indium zinc oxide ($Zr_xIn_yZn_zO$), hafnium indium zinc oxide ($Hf_x$-$In_yZn_zO$), tin indium zinc oxide ($Sn_xIn_yZn_zO$), aluminum tin indium zinc oxide ($Al_xSn_yIn_zZn_aO$), silicon indium zinc oxide ($Si_xIn_yZn_zO$), aluminum zinc tin oxide ($Al_xZn_ySn_zO$), gallium zinc tin oxide ($Ga_xZn_ySn_zO$), zirconium zinc tin oxide ($Zr_xZn_ySn_zO$), and other similar materials.

As used herein, the term "homogeneous" means relative amounts of elements included in a feature (e.g., a material, a structure) do not vary throughout different portions (e.g., different horizontal portions, different vertical portions) of the feature. Conversely, as used herein, the term "heterogeneous" means relative amounts of elements included in a feature (e.g., a material, a structure) vary throughout different portions of the feature. If a feature is heterogeneous, amounts of one or more elements included in the feature may vary stepwise (e.g., change abruptly), or may vary continuously (e.g., change progressively, such as linearly, parabolically) throughout different portions of the feature. The feature may, for example, be formed of and include a stack of at least two different materials.

Unless the context indicates otherwise, the materials described herein may be formed by any suitable technique including, but not limited to, spin coating, blanket coating, chemical vapor deposition (CVD), plasma enhanced CVD (PECVD), atomic layer deposition (ALD), plasma enhanced ALD (PEALD), physical vapor deposition (PVD) (e.g., sputtering), or epitaxial growth. Depending on the specific material to be formed, the technique for depositing or growing the material may be selected by a person of ordinary skill in the art. In addition, unless the context indicates otherwise, removal of materials described herein may be accomplished by any suitable technique including, but not limited to, etching (e.g., dry etching, wet etching, vapor etching), ion milling, abrasive planarization (e.g., chemical-mechanical planarization (CMP)), or other known methods.

FIG. 1A through FIG. 10B are various views (described in further detail below) illustrating a microelectronic device structure at different processing stages of a method of forming a microelectronic device (e.g., a memory device, such as a 3D NAND Flash memory device), in accordance with embodiments of the disclosure. With the description provided below, it will be readily apparent to one of ordinary skill in the art that the methods described herein may be used for forming various devices. In other words, the methods of the disclosure may be used whenever it is desired to form a microelectronic device.

Figure 1B:
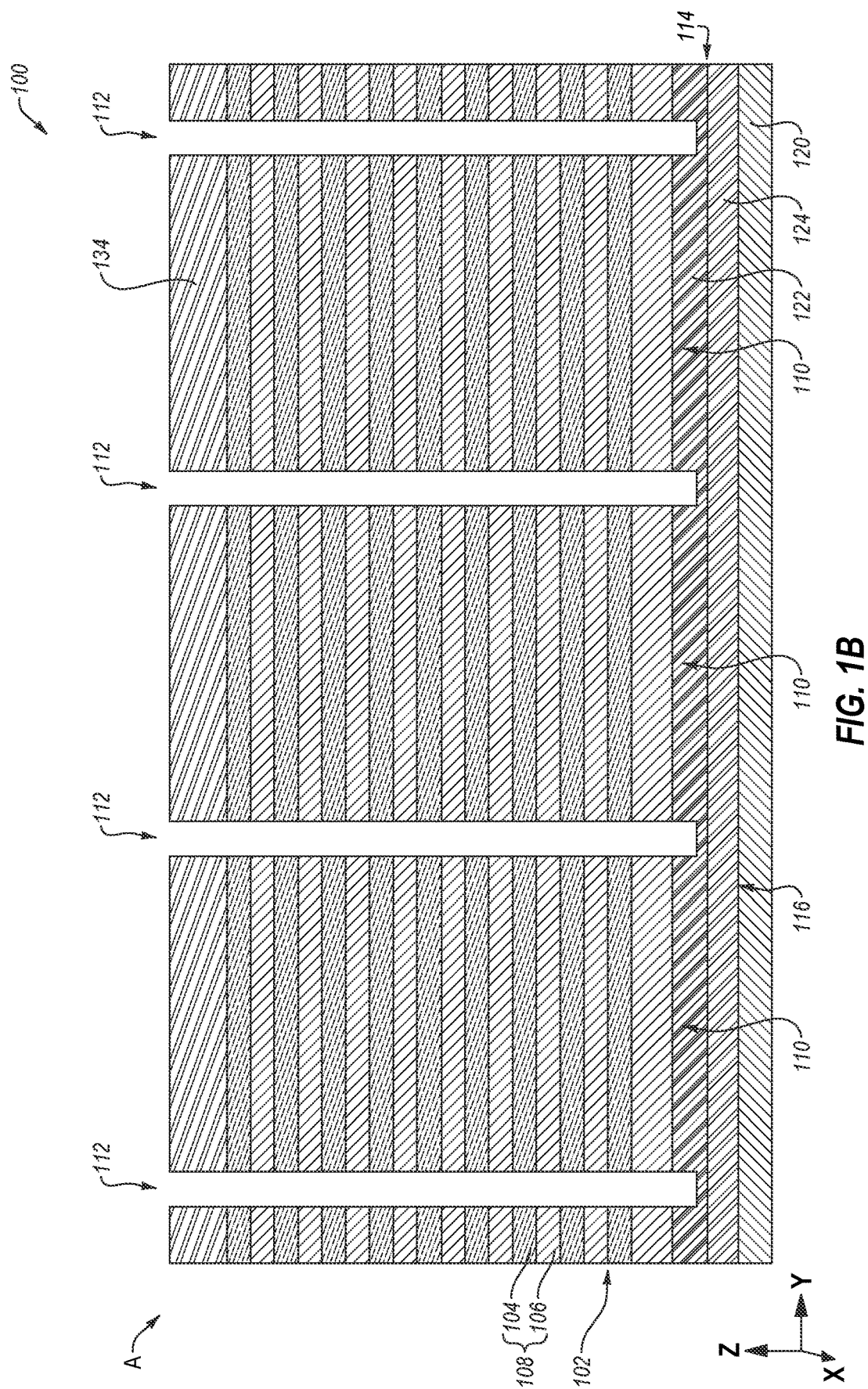
FIG. 1B is a simplified, longitudinal cross-sectional view of a portion A of the microelectronic device structure at the processing stage of FIG. 1A, wherein the portion A is represented by a dashed line A-A shown in FIG. 1A.

FIG. 1A is a simplified, longitudinal cross-sectional view of a portion of a microelectronic device structure 100 at a processing stage of a method of forming a microelectronic device, in accordance with embodiments of the disclosure. As shown in FIG. 1A, the microelectronic device structure 100 may be formed to include a stack structure 102 on or over a source tier 114. As described in further detail below, the microelectronic device structure 100 further includes additional features (e.g., materials, structures, regions, devices) within boundaries of the different horizontal regions thereof. FIG. 1B is a simplified, longitudinal cross-sectional view of a portion A of the microelectronic device structure 100 at the processing stage of FIG. 1A, wherein the portion A is represented by a dashed line A-A shown in FIG. 1A.

As shown in FIG. 1A, the stack structure 102 of the microelectronic device structure 100 includes a vertically alternating (e.g., in the Z-direction) sequence of conductive material 104 and insulative material 106 arranged in tiers 108. Each of the tiers 108 of the stack structure 102 may individually include the conductive material 104 vertically neighboring (e.g., directly vertically adjacent) the insulative material 106. The stack structure 102 may be formed to include any desired number of the tiers 108. By way of non-limiting example, the stack structure 102 may be formed to include greater than or equal to sixteen (16) of the tiers 108, such as greater than or equal to thirty-two (32) of the tiers 108, greater than or equal to sixty-four (64) of the tiers 108, greater than or equal to one hundred and twenty-eight (128) of the tiers 108, or greater than or equal to two hundred and fifty-six (256) of the tiers 108.

The conductive material 104 of the tiers 108 of the stack structure 102 may formed of and include one or more of at least one conductively doped semiconductor material, at least one metal, at least one alloy, and at least one conductive metal-containing material (e.g., at last one conductive metal nitride, at least one conductive metal silicide, at least one conductive metal carbide, at least one conductive metal oxide). In some embodiments, the conductive material 104 is formed of and includes W. Optionally, at least one liner material (e.g., at least one insulative liner material, at least one conductive liner materials) may be formed around the conductive material 104. The liner material may, for example, be formed of and include one or more of a metal (e.g., titanium, tantalum), an alloy, a metal nitride (e.g., tungsten nitride, titanium nitride, tantalum nitride), and a metal oxide (e.g., aluminum oxide). In some embodiments, the liner material comprises at least one conductive material employed as a seed material for the formation of the conductive material 104. In some embodiments, the liner material comprises titanium nitride ($TiN_x$, such as TiN). In further embodiments, the liner material further includes aluminum oxide ($AlO_x$, such as $Al_2O_3$). As a non-limiting example, for each of the tiers 108 of the stack structure 102, $AlO_x$, (e.g., $Al_2O_3$) may be formed directly adjacent the insulative material 106, $TiN_x$ (e.g., TiN) may be formed directly adjacent the $AlO_x$, and W may be formed directly adjacent the $TiN_x$. For clarity and ease of understanding the description, the liner material is not illustrated in FIGS. 1A and 1B, but it will be understood that the liner material may be disposed around the conductive material 104.

The insulative material 106 of each of the tiers 108 of the stack structure 102 may be formed of and include at least one dielectric material, such one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, $TiO_x$, $ZrO_x$, $TaO_x$, and $MgO_x$), at least one dielectric nitride material (e.g., $SiN_y$), at least one dielectric oxynitride material (e.g., $SiO_xN_y$), and at least one dielectric carboxynitride material (e.g., $SiO_xC_zN_y$). In some embodiments, the insulative material 106 of each of the tiers 108 of the stack structure 102 is formed of and includes a dielectric oxide material, such as SiO$_x$ (e.g., SiO$_2$). The insulative material 106 of each of the tiers 108 may be substantially homogeneous, or the insulative material 106 of one or more (e.g., each) of the tiers 108 may be heterogeneous.

Referring to FIG. 1B, the stack structure 102 may be divided (e.g., segmented, partitioned) into blocks 110 separated from one another by slots 112 (e.g., slits, openings, trenches). The slots 112 may vertically extend (e.g., in the Z-direction) completely through the stack structure 102, and may horizontally extend in parallel in a first horizontal direction (e.g., the X-direction). As used herein, the term "parallel" means substantially parallel. Horizontally neighboring blocks 110 of the stack structure 102 may be separated from one another in a second horizontal direction (e.g., the Y-direction) orthogonal to the first horizontal direction by the slots 112. The slots 112 may also horizontally extend parallel in the first horizontal direction. Each of the blocks 110 of the stack structure 102 may exhibit substantially the same geometric configuration (e.g., substantially the same dimensions and substantially the same shape) as each other of the blocks 110, or one or more of the blocks 110 may exhibit a different geometric configuration (e.g., one or more different dimensions and/or a different shape) than one or more other of the blocks 110. In addition, each pair of horizontally neighboring blocks 110 of the stack structure 102 may be horizontally separated from one another by substantially the same distance (e.g., corresponding to a width in the Y-direction of each of the slots 112) as each other pair of horizontally neighboring blocks 110 of the stack structure 102, or at least one pair of horizontally neighboring blocks 110 of the stack structure 102 may be horizontally separated from one another by a different distance than that separating at least one other pair of horizontally neighboring blocks 110 of the stack structure 102. In some embodiments, the blocks 110 of the stack structure 102 are substantially uniformly (e.g., substantially non-variably, substantially equally, substantially consistently) sized, shaped, and spaced relative to one another.

Referring again to FIG. 1A, each block 110 of the stack structure 102 may individually include at least one memory array region 111 and at least one staircase region 113 horizontally neighboring (e.g., in the X-direction) the memory array region 111. The memory array region 111 of an individual block 110 of the stack structure 102 may include pillar structures 126 vertically extending (e.g., in the Z-direction) therethrough and to the source tier 114. In addition, the staircase region 113 of an individual block 110 of the stack structure 102 may include contact structures 132 vertically extending (e.g., in the Z-direction) therethrough and to the source tier 114. Additional features are also included within horizontal areas of the memory array region 111 and staircase region 113 of individual blocks 110 of the stack structure 102, as described in further detail below.

Within the memory array region 111 of an individual block 110 of the stack structure 102, the pillar structures 126 may vertically extend through the tiers 108 of the stack structure 102. The pillar structures 126 may each individually be formed of and include a stack of materials. By way of non-limiting example, each of the pillar structures 126 may be formed to include a charge-blocking material, such as first dielectric oxide material (e.g., SiO$_x$, such as SiO$_2$; AlO$_x$, such as Al$_2$O$_3$); a charge-trapping material, such as a dielectric nitride material (e.g., SiN$_y$, such as Si$_3$N$_4$); a tunnel dielectric material, such as a second dielectric oxide material (e.g., SiO$_x$, such as SiO$_2$); a channel material, such as a semiconductor material (e.g., silicon, such as polycrystalline silicon); and a dielectric fill material (e.g., a dielectric oxide, a dielectric nitride, air). For an individual pillar structure 126, at least one first vertical portion (e.g., a vertical portion employed to form a vertically extending string of memory cells, as described in further detail below) thereof may include the charge-blocking material formed on or over surfaces (e.g., side surfaces) of the conductive material 104 and the insulative material 106 of some of the tiers 108 of stack structure 102 partially defining horizontal boundaries of the pillar structure 126; the charge-trapping material horizontally surrounded by the charge-blocking material; the tunnel dielectric material horizontally surrounded by the charge-trapping material; the channel material horizontally surrounded by the tunnel dielectric material; and the dielectric fill material horizontally surrounded by the channel material. Furthermore, second vertical portions (e.g., upper and lower vertical portions employed to form select transistors, as also described in further detail below) of the pillar structure 126 may include the tunnel dielectric material formed on or over surfaces (e.g., side surfaces) of the conductive material 104 and the insulative material 106 of some other of the tiers 108 of stack structure 102 partially defining horizontal boundaries of the pillar structure 126; the channel material horizontally surrounded by the tunnel dielectric material; and the dielectric fill material horizontally surrounded by the channel material. The second vertical portions of the pillar structure 126 may be at least partially (e.g., substantially) free of the charge-blocking material and the charge-trapping material present within first vertical portion of the pillar structure 126.

Intersections of the pillar structures 126 and the conductive material 104 of some of the tiers 108 (e.g., access line tiers, word line tiers) of the stack structure 102 may define vertically extending strings of memory cells 128 coupled in series with one another within the block 110 of the stack structure 102. In some embodiments, the memory cells 128 formed at the intersections of the conductive material 104 of some of the tiers 108 (e.g., access line tiers) and the pillar structures 126 comprise so-called "MONOS" (metal-oxide-nitride-oxide-semiconductor) memory cells. In additional embodiments, the memory cells 128 comprise so-called "TANOS" (tantalum nitride-aluminum oxide-nitride-oxide-semiconductor) memory cells, or so-called "BETANOS" (band/barrier engineered TANOS) memory cells, each of which are subsets of MONOS memory cells. In further embodiments, the memory cells 128 comprise so-called "floating gate" memory cells including floating gates (e.g., metallic floating gates) as charge storage structures. The floating gates may horizontally intervene between central structures of the pillar structures 126 and the conductive material 104 of some of the tiers 108 of the stack structure 102. The vertically extending strings of memory cells 128 together form at least one memory array within an individual block 110 of the stack structure 102. In addition, intersections of the pillar structures 126 and the conductive material 104 of some other of the tiers 108 (e.g., select gate tiers) of the stack structure 102 may define select transistors (e.g., select gate drain (SGD) transistors, select gate source (SGS) transistors) coupled in series with the vertically extending strings of memory cells 128. In some embodiments, the select transistors comprise metal-oxide-semiconductor (MOS) transistors.

Still referring to FIG. 1A, within a horizontal area of the memory array region 111 of an individual block 110 of the stack structure 102, the microelectronic device structure 100 may further include plug structures 130 in electrical communication with the pillar structures 126. Individual plug structures 130 may vertically overlie (e.g., in the Z-direction) and at least partially horizontally overlap (e.g., in the X-direction, in the Y-direction) individual pillar structures 126. The plug structures 130 may be employed to facilitate electrical communication between the pillar structures 126 (and, hence, the memory cells 128) and digit line structures (e.g., bit line structures, data line structures) to subsequently be formed over the stack structure 102, as described in further detail below. The plug structures 130 may be formed of and include conductive material. As a non-limiting example, the plug structures 130 may be formed of and include one or more of at least one metal, at least one alloy, and at least one conductive metal-containing material (e.g., a conductive metal nitride, a conductive metal silicide, a conductive metal carbide, a conductive metal oxide). In some embodiments, the plug structures 130 are individually formed of and includes W. The plug structures 130 may individually be homogeneous, or the plug structures 130 may individually be heterogeneous.

Within the staircase region 113 of an individual block 110 of the stack structure 102, the contact structures 132 may vertically extend through the tiers 108 of the stack structure 102. At least some of the contact structures 132 may be positioned within one or more crest sub-regions 115 (e.g., relatively vertically elevated regions) of the staircase region 113. At least one of the crest sub-regions 115 (e.g., a first crest sub-region 115) may be horizontally interposed (e.g., in the X-direction) between the memory array region 111 and one or more staircase structures within the staircase region 113. Such staircase structures may individually include steps defined by horizontal ends (e.g., edges) of the tiers 108 of the stack structure 102, as described in further detail below.

At least some of the contact structures 132 (e.g., at least those contact structures 132 serving as "active" or "live" contact structures) may be formed of and include at least one conductive material, such as one or more of a metal (e.g., W, Ti, Mo, Nb, V, Hf, Ta, Cr, Zr, Fe, Ru, Os, Co, Rh, Jr, Ni, Pa, Pt, Cu, Ag, Au, Al), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a Mg-based alloy, a Ti-based alloy, a steel, a low-carbon steel, a stainless steel), a conductive metal-containing material (e.g., a conductive metal nitride, a conductive metal silicide, a conductive metal carbide, a conductive metal oxide), a conductively-doped semiconductor material (e.g., conductively doped Si, conductively doped Ge, conductively doped SiGe). Optionally, at least some other of the contact structures 132 (e.g., other of the contact structures 132 serving as "support" or "dummy" contact structures) may be formed of and include at least one different material, such as one or more of at least one semiconductive material (e.g., polycrystalline silicon) and at least one insulative material. In addition, at least one dielectric liner material may substantially surround (e.g., substantially horizontally and vertically cover) sidewalls of individual contact structures 132. The dielectric liner material may be horizontally interposed between individual contact structures 132 and the tiers 108 (including the conductive material 104 and the insulative material 106 thereof) of the stack structure 102. The dielectric liner material may be formed of and include one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, $TiO_x$, $ZrO_x$, $TaO_x$, and $MgO_x$), at least one dielectric nitride material (e.g., $SiN_y$), at least one dielectric oxynitride material (e.g., $SiO_xN_y$), at least one dielectric carboxynitride material (e.g., $SiO_xC_zN_y$), and amorphous carbon. In some embodiments, the dielectric liner material comprises $SiO_2$.

Still referring to FIG. 1A, the source tier 114 vertically underlying the stack structure 102 may include at least one source structure 116 (e.g., a source plate) and discrete conductive structures 118 (e.g., discrete conductive island structures) horizontally separated (e.g., in the X-direction and in the Y-direction) from the source structure 116 and from one another. The source structure 116 and the discrete conductive structures 118 may be located at substantially the same vertical position (e.g., in the Z-direction) within the microelectronic device structure 100 as one another. Dielectric material 120 may be horizontally interposed between (e.g., in the X-direction and in the Y-direction) the discrete conductive structures 118 and may also be horizontally interposed between the discrete conductive structures 118 and the source structure 116. Put another way, the dielectric material 120 may horizontally intervene between and separate horizontally neighboring discrete conductive structures 118 of the source tier 114, and may also horizontally intervene between and separate the source structure 116 and the discrete conductive structures 118 of the source tier 114. The dielectric material 120 may be formed of and include one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, $TiO_x$, $ZrO_x$, $TaO_x$, and $MgO_x$), at least one dielectric nitride material (e.g., $SiN_y$), at least one dielectric oxynitride material (e.g., $SiO_xN_y$), at least one dielectric carboxynitride material (e.g., $SiO_xC_zN_y$), and amorphous carbon. In some embodiments, the dielectric material 120 comprises $SiO_2$.

The source structure 116 and the discrete conductive structures 118 may each individually be formed of and include at least one conductive material, such as one or more of a metal (e.g., W, Ti, Mo, Nb, V, Hf, Ta, Cr, Zr, Fe, Ru, Os, Co, Rh, Jr, Ni, Pa, Pt, Cu, Ag, Au, Al), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a Mg-based alloy, a Ti-based alloy, a steel, a low-carbon steel, a stainless steel), a conductive metal-containing material (e.g., a conductive metal nitride, a conductive metal silicide, a conductive metal carbide, a conductive metal oxide), a conductively doped semiconductor material (e.g., conductively doped Si, conductively doped Ge, conductively doped SiGe). In some embodiments, the source structure 116 and the discrete conductive structures 118 each include a first conductive material 122, and a second conductive material 124 vertically underlying and having a different material composition that the first conductive material 122. By way of non-limiting example, the first conductive material 122 may be formed of and include conductively doped polycrystalline silicon, and the second conductive material 124 may be formed of and include a conductive metal silicide material (e.g., tungsten silicide ($WSi_x$)).

As shown in FIG. 1A, the source structure 116 of the source tier 114 may horizontally overlap (e.g., in the X-direction and in the Y-direction) the memory array regions 111 of the blocks 110 of the stack structure 102. The pillar structures 126 within the memory array regions 111 may vertically extend to and contact the source structure 116 of the source tier 114. In addition, at least some of the discrete conductive structures 118 of the source tier 114 may horizontally overlap (e.g., in the X-direction and in the Y-direction) the staircase regions 113 of the blocks 110 of the stack structure 102. The contact structures 132 within the staircase regions 113 may vertically extend to and contact the discrete conductive structures 118 of the source tier 114.

The source structure 116 and at least some of the discrete conductive structures 118 of the source tier 114 may be electrically connected to different conductive routing vertically underlying the source tier 114. In turn, such conductive routing may be electrically connected to additional structures and/or devices (e.g., back end of line (BEOL) devices; control logic devices, such as CMOS devices) vertically underlying the microelectronic device structure 100. At least some of the contact structures 132 contacting at least some of the discrete conductive structures 118 in electrical communication with conductive routing vertically underlying the source tier 114 may be configured as "active" or "live" contact structures employed to relay signals received from the conductive routing to additional features (e.g., additional structures, additional devices) of a microelectronic device formed following subsequent processing of the microelectronic device structure 100. In addition, at least some other of the contact structures 132 contacting at least some other of the discrete conductive structures 118 not in electrical communication with conductive routing vertically underlying the source tier 114 may be configured as "support" or "dummy" contact structures that are not used to relay signals received from the conductive routing to additional features (e.g., additional structures, additional devices) of the microelectronic device formed following the subsequent processing of the microelectronic device structure 100.

Referring collectively to FIGS. 1A and 1B, the microelectronic device structure 100 may further include isolation material 134 vertically overlying and within horizontal areas of the blocks 110 of the stack structure 102. The isolation material 134 may be substantially confined within the horizontal areas of the blocks 110 of the stack structure 102, and may continuously horizontally extend over the memory array regions 111 and the staircase regions 113 of the blocks 110. The isolation material 134 may be formed of and include one or more of at least one dielectric material, such as one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, $TiO_x$, $ZrO_x$, $TaO_x$, and $MgO_x$), at least one dielectric nitride material (e.g., $SiN_y$), at least one dielectric oxynitride material (e.g., $SiO_xN_y$), at least one dielectric carboxynitride material (e.g., $SiO_xC_zN_y$), and amorphous carbon. In some embodiments, the isolation material 134 is formed of and includes $SiO_x$ (e.g., $SiO_2$).

Referring to FIG. 1A, as a result of processing (e.g., so-called "replacement gate" or "gate last" processing) employed to form the conductive material 104 of the tiers 108 of the stack structure 102, portions of the tiers 108 of the stack structure 102 within the staircase regions 113 of the blocks 110 of the stack structure 102 may exhibit vertical shrinkage relative to other portions of tiers 108 of the stack structure 102 within the memory array regions 111 of the blocks 110 of the stack structure 102. For an individual block 110 of the stack structure 102, such vertical shrinkage may be initiated at or horizontally proximate an interface of the memory array region 111 and the staircase region 113, such as at, proximate, or within a first crest sub-region 115 of the staircase region 113 most horizontally proximate the memory array region 111. Such vertical shrinkage may result in a dished section 136 of the block 110, wherein for each tier 108 of at least some of the tiers 108 (e.g., at least a relatively vertically higher groups of the tiers 108), a portion of the tier 108 within the staircase region 113 of the block 110 is vertically offset from (e.g., vertically underlies) an additional portion of the tier 108 within the memory array region 111. For example, the conductive material 104 of each tier 108 of the at least some of the tiers 108 may horizontally extend (e.g., in the X-direction) continuously through the memory array region 111 and at least the first crest sub-region 115 of the staircase region 113, but a portion of the tier 108 within the staircase region 113 of the block 110 vertically underlies an additional portion of the tier 108 within the memory array region 111. In some embodiments, because of the dished section 136 of an individual block 110, a portion of an upper surface of an uppermost tier 108 within the staircase region 113 of the block 110 vertically underlies an additional portion of the upper surface of the uppermost tier 108 within the memory array region 111 of the block 110 by vertical offset (e.g., vertical distance) within a range of from about 50 nanometers (nm) to about 400 nm (e.g., from about 100 nm to about 300 nm). The dished section 136 of an individual block 110 effectuates a non-planar topography of an upper boundary (e.g., an uppermost surface) of the block 110, as well as a non-planar topography of an upper boundary (e.g., an uppermost surface) of the isolation material 134 formed thereover.

The non-planar topography of upper boundaries (e.g., an uppermost surfaces) of the blocks 110 of the stack structure 102 (and of the isolation material 134 formed thereover) the may effectuate challenges during subsequent processing acts (e.g., photolithographic patterning acts), relative to substantially planar upper boundaries. For example, absent (e.g., without) the methods of the disclosure (described in further detail below), the dished section 136 of an individual block 110 may effectuate depth of focus challenges (e.g., focus mismatches) across the memory array region 111 and the staircase region 113 of the block 110 during at least some photolithographic patterning acts subsequently performed to form a microelectronic device including the microelectronic device structure 100. However, the methods of the disclosure, as described in further detail below, may effectuate substantially more planar uppermost boundaries within horizontal areas of the blocks 110 of the stack structure 102 in advance of such photolithographic patterning acts, so as to significantly mitigate the challenges (e.g., depth of focus challenges, feature positioning challenges) that would otherwise be associated with the photolithographic patterning acts. The methods of the disclosure may also resolve challenges (e.g., material residue challenges) that may otherwise (e.g., in the absence of the methods of the disclosure) be associated with subsequently filling the slots 112 (FIG. 1B) between the blocks 110 with material (e.g., insulative material, semiconductive material), as described in further detail below.

Figure 2:
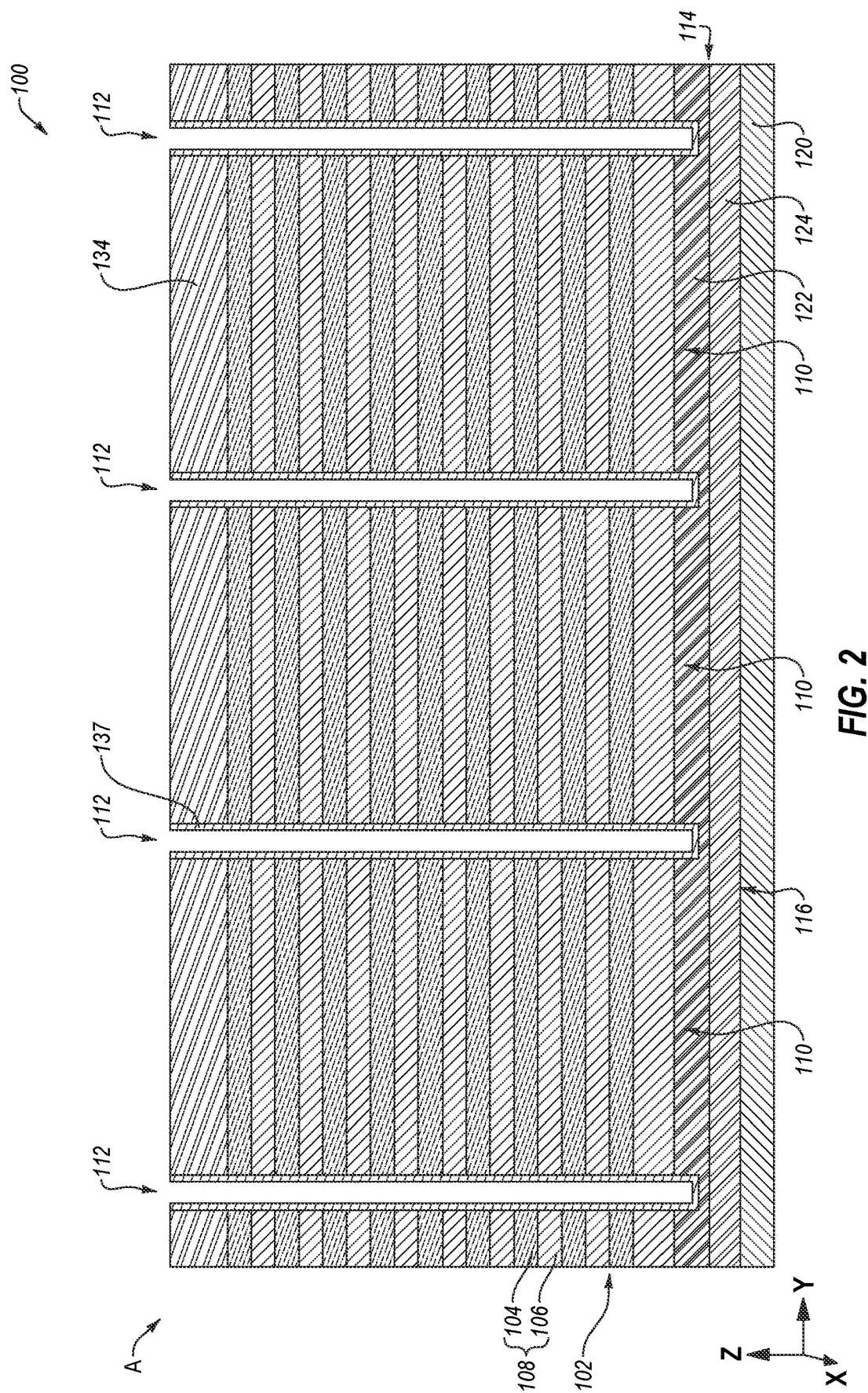
FIG. 2 is a simplified, longitudinal cross-sectional view of the portion A of the microelectronic device structure shown in FIG. 1B at another processing stage of the method of forming the microelectronic device following the processing stage of FIGS. 1A and 1B.

FIG. 2 is a simplified, longitudinal cross-sectional view of the portion A of the microelectronic device structure 100 shown in FIG. 1B following the processing stage previously described with reference to FIGS. 1A and 1B. As shown in FIG. 2, a dielectric liner material 137 may be formed (e.g., conformally formed) at least within the slots 112 interposed between the blocks 110 of the stack structure 102. The dielectric liner material 137 may be formed to at least substantially cover and substantially continuously extend across surfaces of microelectronic device structure 100 defining horizontal boundaries and lower vertical boundaries of the slots 112. For example, the dielectric liner material 137 may be formed to substantially cover surfaces of the stack structure 102 (including the tiers 108 of the conductive material 104 and the insulative material 106 thereof), the isolation material 134, and features (e.g., materials, structures) of the source tier 114 defining the horizontal boundaries and the lower vertical boundaries of the slots 112. The dielectric liner material 137 may be formed to partially (e.g., less than completely) fill the slots 112.

The dielectric liner material 137 may be formed of and include at least one dielectric material, such as a one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, and $TiO_x$), at least one dielectric nitride material (e.g., $SiN_y$), at least one dielectric oxynitride material (e.g., $SiO_xN_y$), and at least one dielectric carboxynitride material (e.g., $SiO_xC_zN_y$). In some embodiments, the dielectric liner material 137 is formed of and includes $SiO_x$ (e.g., $SiO_2$).

The dielectric liner material 137 may be formed to a desired thickness, such as a thickness within a range of from about 10 nanometers (nm) to about 200 nm, from about 10 nm to about 100 nm, from about 10 nm to about 50 nm, or from about 10 nm to about 20 nm. In some embodiments, the thickness of the dielectric liner material 137 is within a range of from about 10 nm to about 50 nm. The thickness of the dielectric liner material 137 may be substantially uniform (e.g., substantially non-variable) across each of the surfaces upon which the dielectric liner material 137 if formed, or the thickness of the dielectric liner material 137 may be at least partially non-uniform (e.g., variable) across one or more of the surfaces upon which the dielectric liner material 137 is formed.

While FIG. 2 depicts the dielectric liner material 137 as being substantially confined within boundaries (e.g., horizontal boundaries, vertical boundaries) of the slots 112, the disclosure is not so limited. Rather, the dielectric liner material 137 may be formed to extend (e.g., substantially continuously) beyond the boundaries of the slot 112, such as on or over upper surfaces of the isolation material 134 outside of the horizontal boundaries of the slots 112. In some embodiments, the dielectric liner material 137 is formed (e.g., conformally formed) to substantially cover upper surfaces of the isolation material 134 outside of the horizontal boundaries of the slots 112, as well as the surfaces of the microelectronic device structure 100 defining the horizontal boundaries and lower vertical boundaries of the slots 112.

Figure 3:
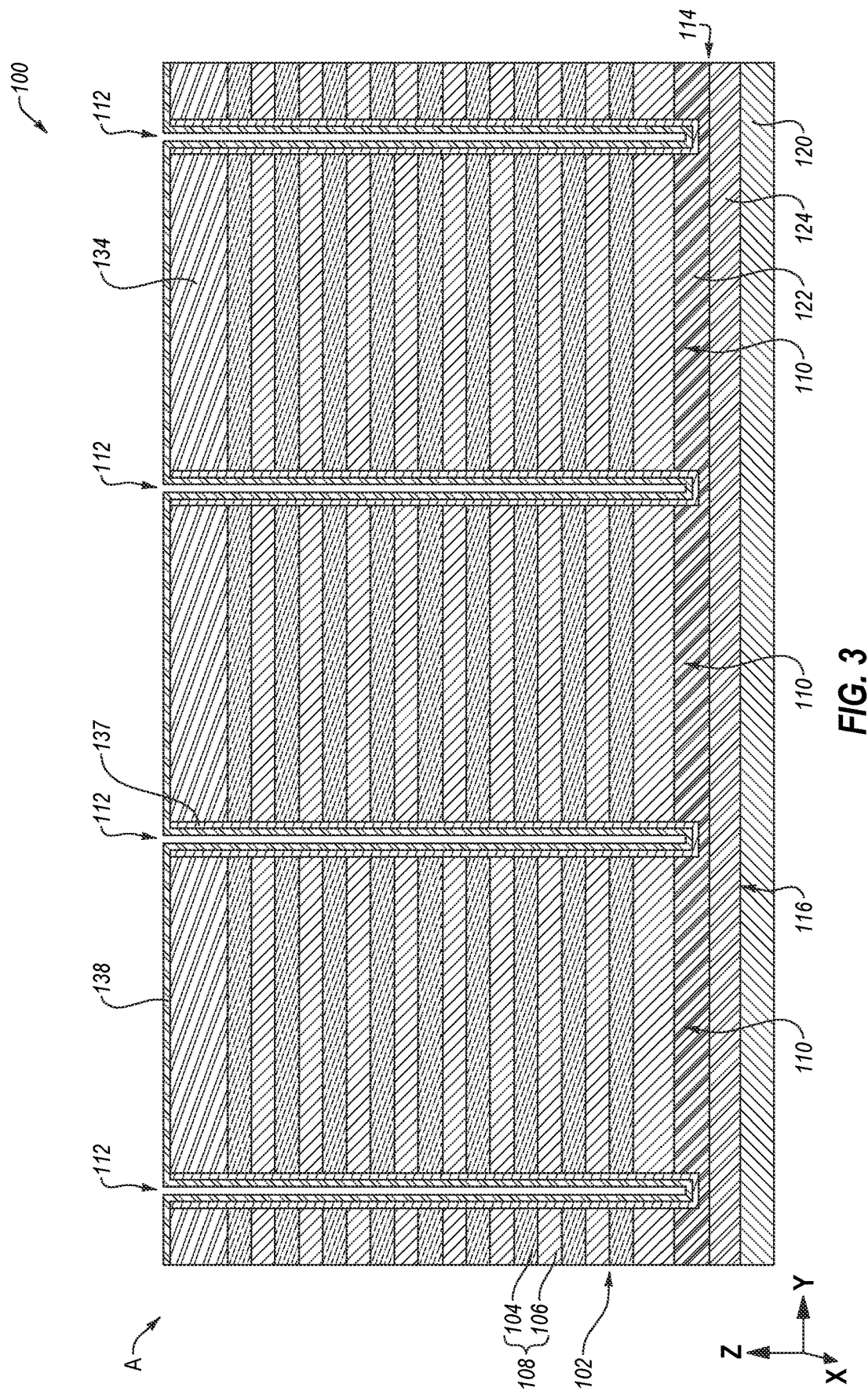
FIG. 3 is a simplified, longitudinal cross-sectional view of the portion A of the microelectronic device structure shown in FIG. 2 at another processing stage of the method of forming the microelectronic device following the processing stage of FIG. 2.

FIG. 3 is a simplified, longitudinal cross-sectional view of the portion A of the microelectronic device structure 100 shown in FIG. 2 following the processing stage previously described with reference to FIG. 2. As shown in FIG. 3, an additional liner material 138 may be formed (e.g., conformally formed) inside and outside of the boundaries of the slots 112. The additional liner material 138 may be formed to substantially cover and continuously extend across exposed surfaces of the microelectronic device structure 100 (e.g., exposed surfaces of the dielectric liner material 137, exposed surfaces of the isolation material 134 (if any)) inside and outside of the boundaries of the slots 112. The additional liner material 138 may be formed to partially (e.g., less than completely) fill portions of the slots 112 remaining unfilled (e.g., unoccupied) by the dielectric liner material 137.

The additional liner material 138 may be formed of and include one or more of at least one semiconductive material (also referred to herein as a "semi-insulative material") and at least one dielectric material. A material composition of the additional liner material 138 may be different than a material composition of the dielectric liner material 137. In some embodiments, the additional liner material 138 is formed of and includes polycrystalline silicon.

The additional liner material 138 may be formed to a desired thickness that does not result in substantially filling the portions of the slots 112 remaining unfilled by the dielectric liner material 137. By way of non-limiting example, the additional liner material 138 may be formed to a thickness less than about 50 percent of horizontal width (e.g., diameter) in the second horizontal direction (e.g., the Y-direction) of the portion of an individual slot 112 remaining unfilled by the dielectric liner material 137. The thickness of the additional liner material 138 may be substantially uniform (e.g., substantially non-variable) across each of the surfaces upon which the additional liner material 138 if formed, or the thickness of the additional liner material 138 may be at least partially non-uniform (e.g., variable) across one or more of the surfaces upon which the additional liner material 138 is formed.

Figure 4:
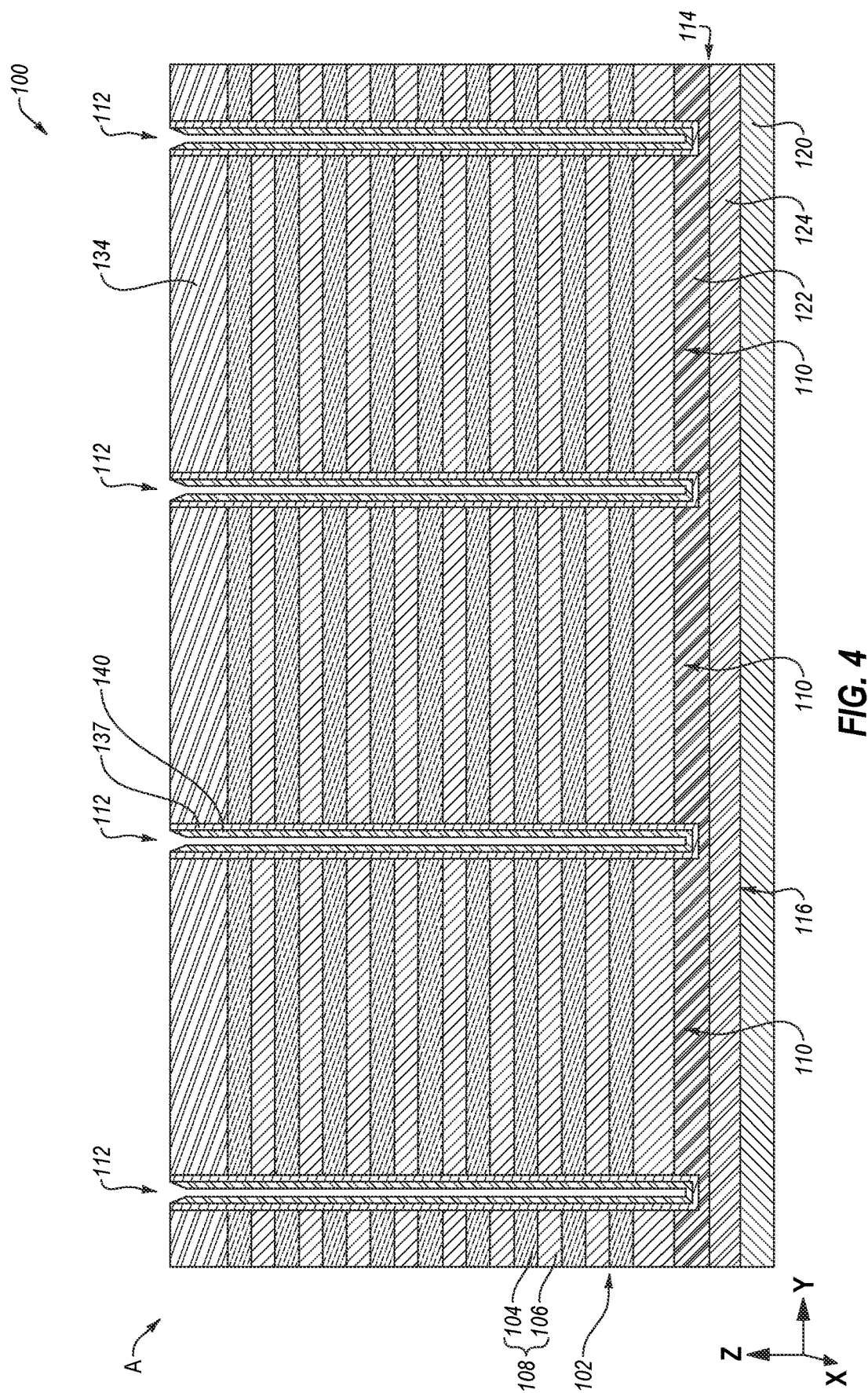
FIG. 4 is a simplified, longitudinal cross-sectional view of the portion A of the microelectronic device structure shown in FIG. 3 at another processing stage of the method of forming the microelectronic device following the processing stage of FIG. 3.

FIG. 4 is a simplified, longitudinal cross-sectional view of the portion A of the microelectronic device structure 100 shown in FIG. 3 following the processing stage previously described with reference to FIG. 3. As shown in FIG. 4, the microelectronic device structure 100 may be subjected to at least one material removal process (e.g., at least one dry etching process) to form liner structures 140 from the additional liner material 138 (FIG. 3). To form the liner structures 140, the material removal process may substantially remove portions of the additional liner material 138 (FIG. 3) outside of the boundaries of the slots 112, and may also recess (e.g., vertically recess and horizontally recess) portions of the additional liner material 138 (FIG. 3) proximate upper vertical boundaries of the slots 112. Following the formation of the liner structures 140, the slots 112 may individually exhibit an upper unfilled portion (e.g., an upper portion remaining unoccupied by the dielectric liner material 137 and the liner structures 140) and an lower unfilled portion (e.g., lower portions remaining unoccupied by the dielectric liner material 137 and the liner structures 140), wherein the upper unfilled portion is relatively wider in the second horizontal direction (e.g., the Y-direction) than the lower unfilled portion. The upper unfilled portion of an individual slot 112 may vertically overlie an upper boundary of the conductive material 104 of an uppermost tier 108 of the stack structure 102. For example, a lower vertical boundary of the upper unfilled portion of an individual slot 112 may be positioned between an upper vertical boundary and a lower vertical boundary of the isolation material 134 vertically overlying the blocks 110 of the stack structure 102.

As shown in FIG. 4, the liner structures 140 may be substantially confined within boundaries of the slots 112. In some embodiments, portions of the liner structures 140 proximate upper boundaries of the slots 112 exhibit tapered longitudinal profiles that facilitate the upper unfilled portions of the slots 112 being horizontally wider (e.g., in the Y-direction) relative to the lower unfilled portions of the slots 112. For example, the liner structures 140 may vertically extend to upper vertical boundaries of the slots 112 (e.g., at least to upper vertical boundaries of the isolation material 134), but may exhibit progressively reduced horizontal dimensions (e.g., in the Y-direction) within the vertical boundaries of the isolation material 134 as the liner structures 140 approach (e.g., in the positive Z-direction) the upper vertical boundaries of the slots 112. In additional embodiments, the liner structures 140 are not formed to vertically extend to the upper vertical boundaries of the slots 112 (e.g., at least to upper vertical boundaries of the isolation material 134). For example, portions of the dielectric liner material 137 at least proximate the upper vertical boundaries of the slots 112 and within the vertical boundaries of the isolation material 134 may be free of the liner structures 140 thereon. Put another way, the liner structures 140 may be formed to exhibit upper vertical boundaries that vertically underlie upper vertical boundaries of the slots 112 (e.g., upper vertical boundaries of the liner structures 140 may vertically underlie upper vertical boundaries of the isolation material 134).

Figure 5:
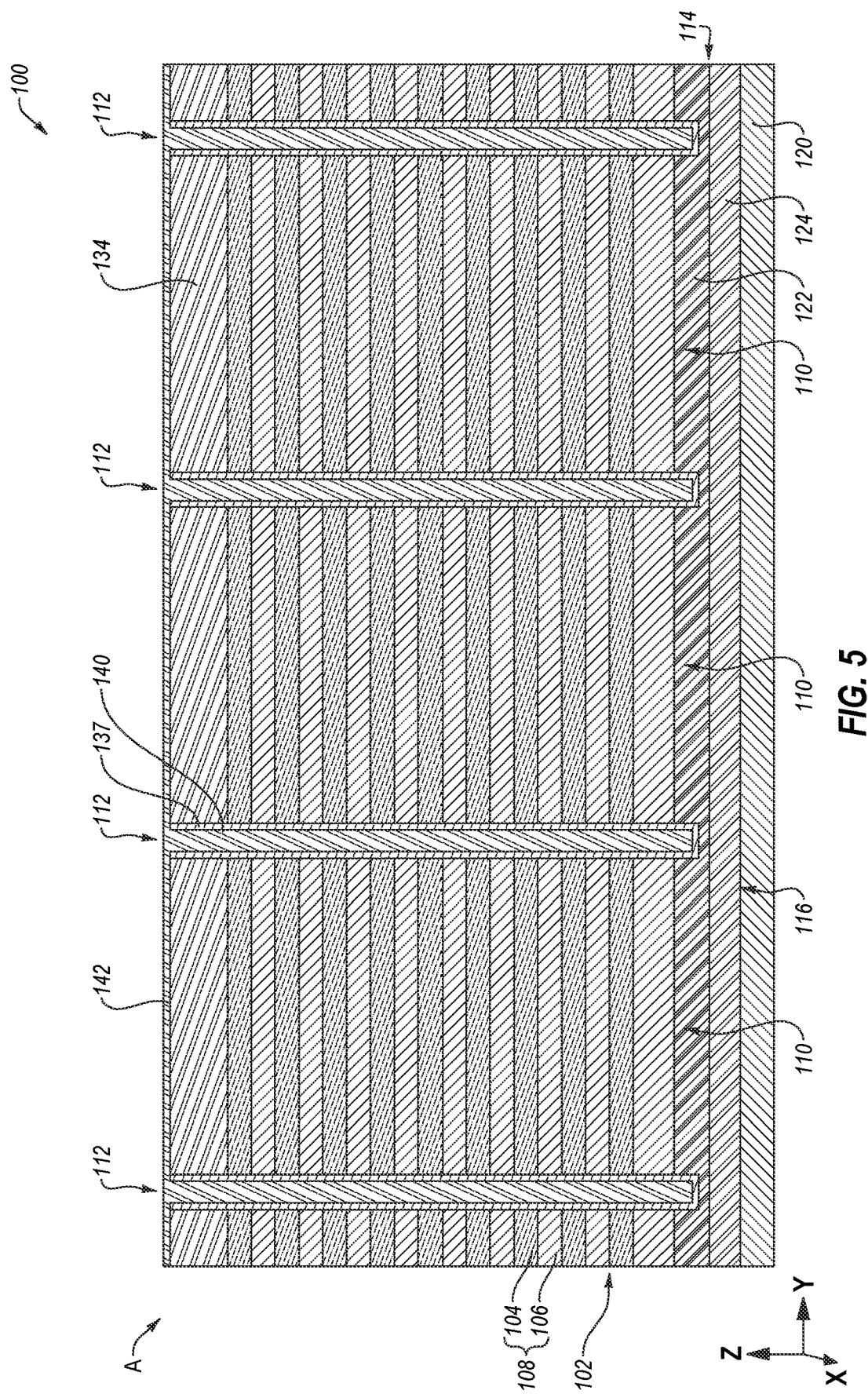
FIG. 5 is a simplified, longitudinal cross-sectional view of the portion A of the microelectronic device structure shown in FIG. 4 at another processing stage of the method of forming the microelectronic device following the processing stage of FIG. 4.

FIG. 5 is a simplified, longitudinal cross-sectional view of the portion A of the microelectronic device structure 100 shown in FIG. 4 following the processing stage previously described with reference to FIG. 4. As shown in FIG. 4, a fill material 142 may be formed (e.g., conformally formed) inside and outside of the boundaries of the slots 112. The fill material 142 may be formed to substantially cover and continuously extend across exposed surfaces of the microelectronic device structure 100 (e.g., exposed surfaces of the liner structures 140, exposed surfaces of the dielectric liner material 137 (if any), exposed surfaces of the isolation material 134 (if any)) inside and outside of the boundaries of the slots 112. The fill material 142 may be formed to substantially fill portions of the slots 112 remaining unfilled (e.g., unoccupied) by the dielectric liner material 137 and the liner structures 140.

The fill material 142 may be formed of and include one or more of at least one semiconductive material and at least one dielectric material. A material composition of the fill material 142 may be substantially the same as a material composition of the liner structures 140, or the material composition of the fill material 142 may be different than the material composition of the liner structures 140. In some embodiments, the fill material 142 is formed of and includes polycrystalline silicon.

During the formation of the fill material 142, the configurations of the liner structures 140 (which, as previously described with reference to FIG. 4, facilitate the relatively wider horizontal dimensions of the upper unfilled portions of the slots 112 as compared to horizontal dimensions of the lower unfilled portions of the slots 112) may promote providing (e.g., depositing) the fill material 142 within the lower unfilled portions of the slots 112 by mitigating bottlenecking of the fill material within the upper unfilled portions of the slots 112. Accordingly, the configurations of the liner structures 140 may mitigate the presence of void spaces (e.g., seams, pin holes) within the slots 112 following the formation of the fill material 142. In some embodiments, the slots 112 are substantially free of void spaces following the formation of the fill material 142. In additional embodiments, the slots 112 exhibit void spaces following the formation of the fill material 142.

Figure 6:
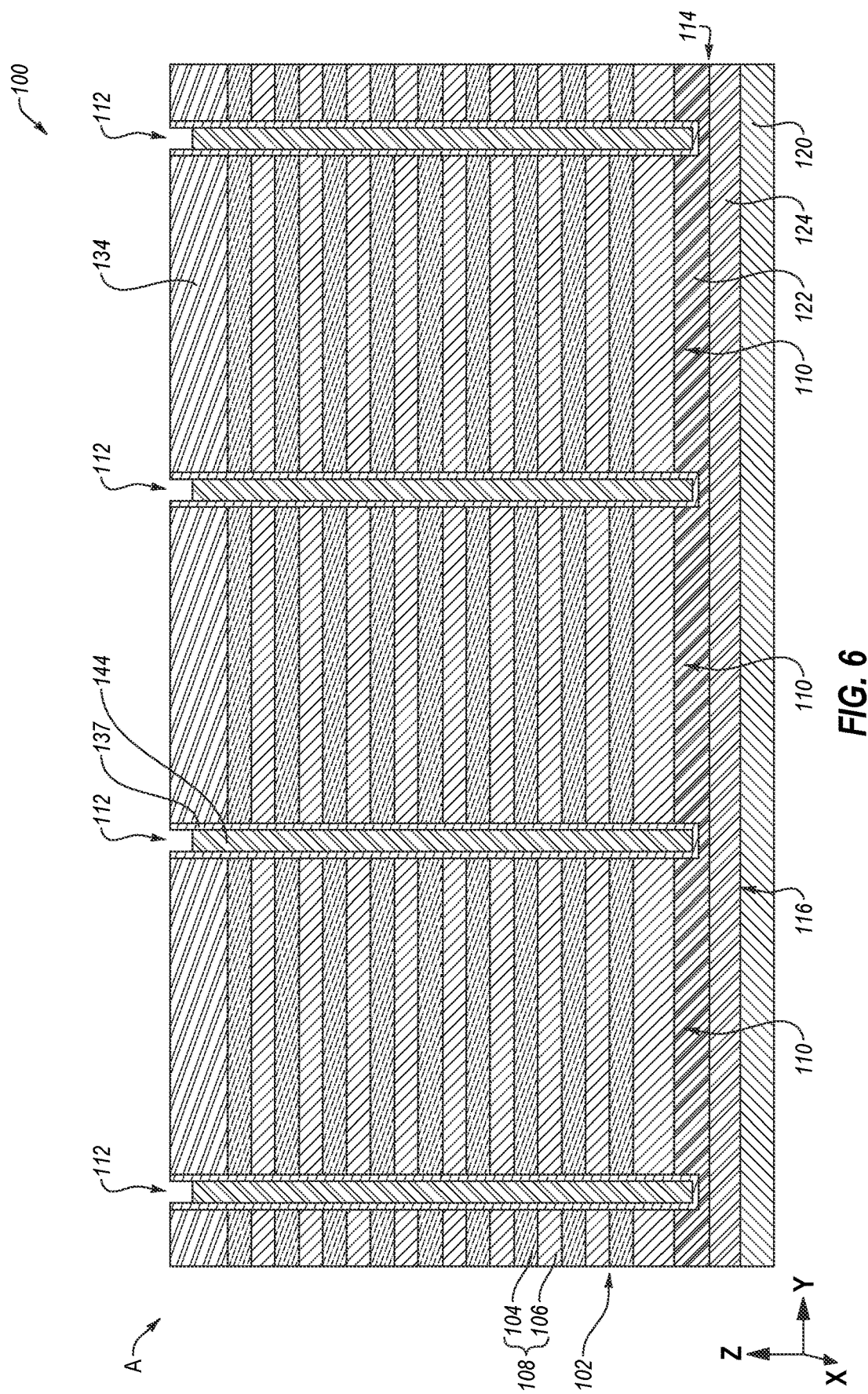
FIG. 6 is a simplified, longitudinal cross-sectional view of the portion A of the microelectronic device structure shown in FIG. 5 at another processing stage of the method of forming the microelectronic device following the processing stage of FIG. 5.

FIG. 6 is a simplified, longitudinal cross-sectional view of the portion A of the microelectronic device structure 100 shown in FIG. 5 following the processing stage previously described with reference to FIG. 5. As shown in FIG. 6, the microelectronic device structure 100 may be subjected to at least one additional material removal process (e.g., at least one additional dry etching process) to form fill structures 144 from the liner structures 140 (FIG. 5) and the fill material 142 (FIG. 5). To form the fill structures 144, the additional material removal process may substantially remove portions of the fill material 142 (FIG. 5) outside of the boundaries of the slots 112, and may also vertically recess portions of the fill material 142 (FIG. 5) and the liner structures 140 (FIG. 5) proximate upper vertical boundaries of the slots 112. Vertically recessing portions of the fill material 142 (FIG. 5) and the liner structures 140 (FIG. 5) proximate upper vertical boundaries of the slots 112 may mitigate (e.g., prevent) subsequent etching (e.g., contact opening etching) problems that may otherwise result from vertical dimensions of the fill material 142 (FIG. 5) and the liner structures 140 (FIG. 5) with portions of the slots 112 within horizontal boundaries in the X-direction of the dished sections 136 (FIG. 1A) of the blocks 110 of the stack structure 102. Following the formation of the fill structures 144, the slots 112 may individually exhibit a newly unfilled portion (e.g., an upper portion remaining unoccupied by the dielectric liner material 137 and the fill structures 144). In some embodiments, a vertical height of the newly unfilled portion of an individual slot 112 is within a range of from about 50 nm to about 300 nm, such as from about 100 nm to about 250 nm, or from about 100 nm to about 200 nm. The newly unfilled portion of an individual slot 112 may vertically overlie an upper boundary of the conductive material 104 of an uppermost tier 108 of the stack structure 102. For example, the newly unfilled portion of an individual slot 112 may be substantially confined within vertical boundaries of the isolation material 134 vertically overlying the blocks 110 of the stack structure 102.

As shown in FIG. 6, the fill structures 144 may be substantially confined within boundaries of the slots 112. The fill structures 144 may be formed to exhibit upper vertical boundaries that vertically underlie upper vertical boundaries of the slots 112. For example, the fill structures 144 may be formed to exhibit upper vertical boundaries that vertically underlie upper vertical boundaries of the isolation material 134 vertically overlying the blocks 110 of the stack structure 102. In addition, the upper vertical boundaries of the fill structures 144 may vertically overlie an upper boundary of the conductive material 104 of an uppermost tier 108 of the stack structure 102. For example, the upper vertical boundaries of the fill structures 144 may positioned between an upper boundary and a lower vertical boundary of the isolation material 134 vertically overlying the blocks 110 of the stack structure 102. Accordingly, a lower vertical boundary of the newly unfilled portion of an individual slot 112 may be positioned between the upper vertical boundary and the lower vertical boundary of the isolation material 134.

Figure 7A:
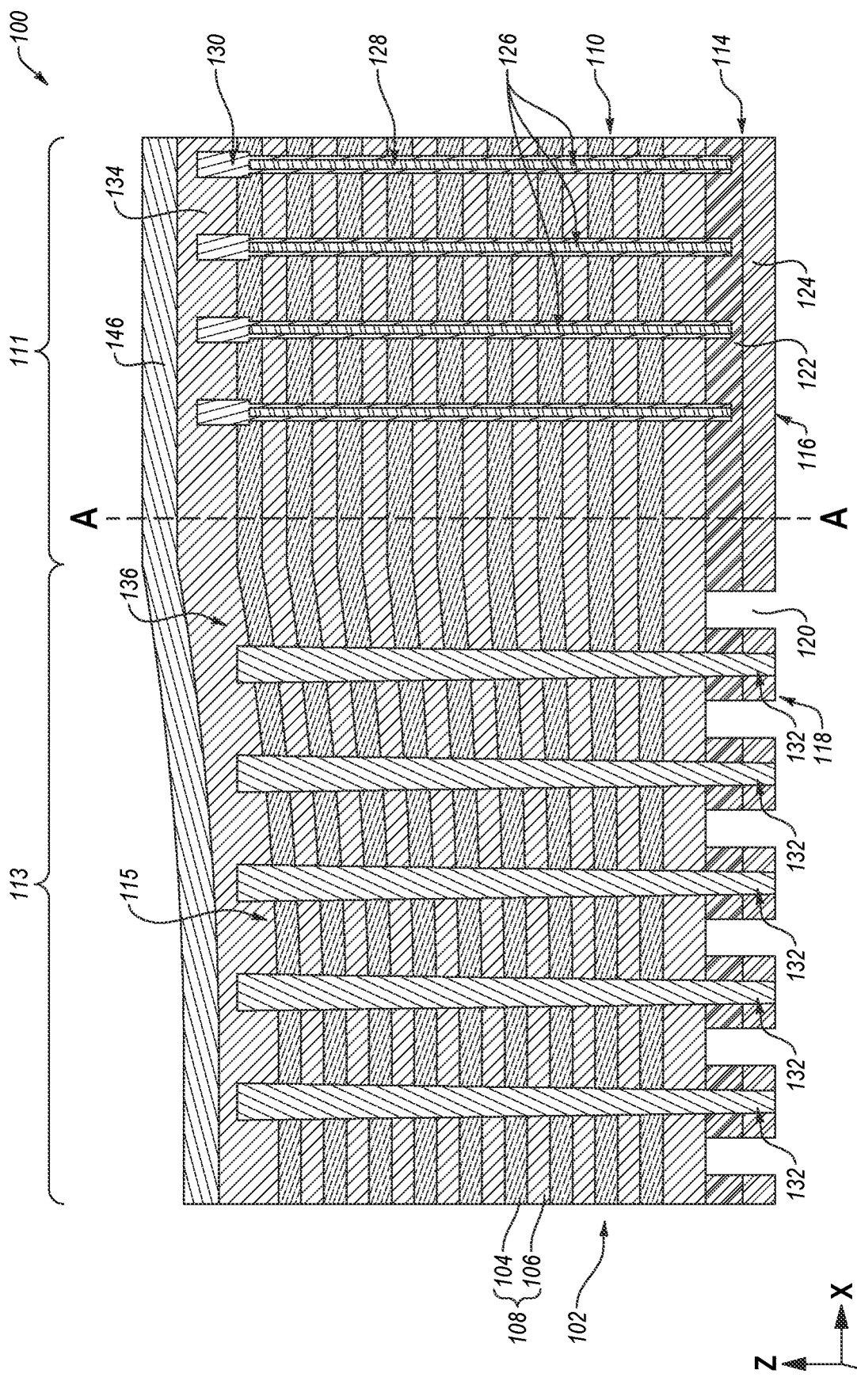
FIG. 7A is a simplified, longitudinal cross-sectional view of the portion of the microelectronic device structure shown in FIG. 1A at another processing stage of the method of forming the microelectronic device following the processing stage of FIG. 6.
Figure 7B:
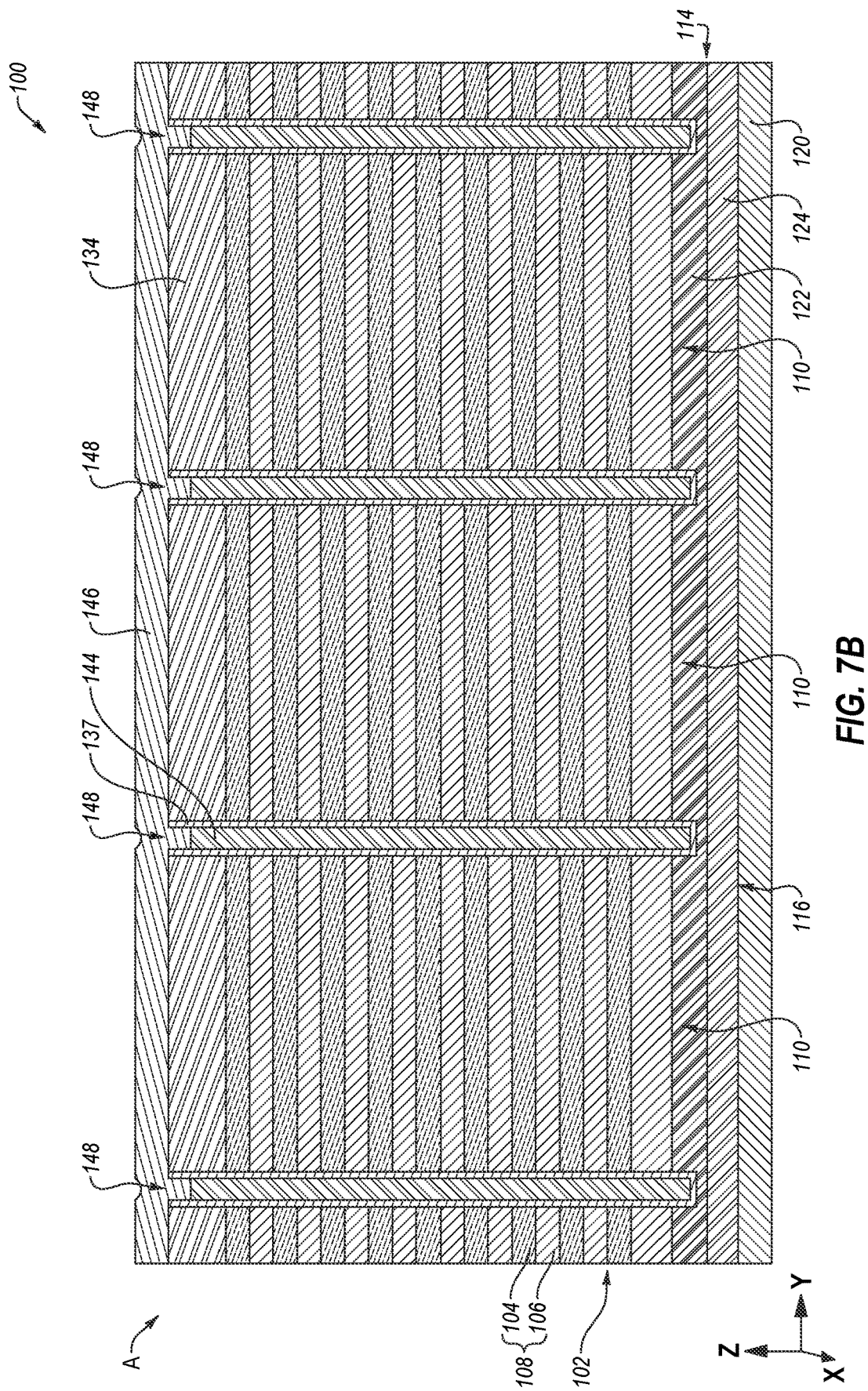
FIG. 7B is a simplified, longitudinal cross-sectional view of the portion A of the microelectronic device structure at the processing stage of FIG. 7A, wherein the portion A is represented by the dashed line A-A shown in FIG. 7A.

FIG. 7A is a simplified, longitudinal cross-sectional view of the portion of the microelectronic device structure 100 shown in FIG. 1A following the processing stage previously described with reference to FIG. 6. FIG. 7B is a simplified, longitudinal cross-sectional view of the portion A of the microelectronic device structure 100 at the processing stage of FIG. 7A, wherein the portion A is represented by the dashed line A-A shown in FIG. 7A. Referring collectively to FIGS. 7A and 7B, a first dielectric material 146 may be formed on or over exposed surfaces of microelectronic device structure 100, such as exposed surfaces of the fill structures 144 (FIG. 7B), exposed surfaces of the dielectric liner material 137 (FIG. 7B), and exposed surfaces of the isolation material 134 (if any). The first dielectric material 146 may substantially fill the newly unfilled portions of the slots 112 (FIG. 6) previously formed at the processing stage previously described with reference to FIG. 6, so as to form filled slot structures 148 (FIG. 7B); and may also substantially continuously horizontally extend across and between the blocks 110 of the stack structure 102, including across the memory array regions 111 (FIG. 7A) and the staircase regions 113 (FIG. 7A) of the blocks 110.

The first dielectric material 146 may be formed of and include at least one dielectric material, such as a one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, and $TiO_x$), at least one dielectric nitride material (e.g., $SiN_y$), at least one dielectric oxynitride material (e.g., $SiO_xN_y$), and at least one dielectric carboxynitride material (e.g., $SiO_xC_zN_y$). In some embodiments, the first dielectric material 146 is formed of and includes a dielectric oxide material (e.g., $SiO_x$, such as $SiO_2$) formed through a high aspect ratio process (HARP). Such a dielectric oxide material is also referred to herein as a HARP oxide. The HARP oxide may be formed by way of a thermal, non-plasma-based CVD process that facilitates substantially filling the newly unfilled portions of the slots 112 (FIG. 6) previously formed at the processing stage previously described with reference to FIG. 6; or the HARP oxide may be formed by way of a PECVD process that facilitates substantially filling the newly unfilled portions of slots 112 (FIG. 6) previously formed at the processing stage previously described with reference to FIG. 6. In additional embodiments, the first dielectric material 146 is formed of and includes an ALD oxide formed by way of an ALD process.

The first dielectric material 146 may at least partially (e.g., substantially) conform to a topography defined by the surfaces (e.g., horizontal surfaces, vertical surfaces) upon which the first dielectric material 146 is formed. As shown in FIG. 7A, a topography of upper vertical boundaries and lower vertical boundaries of the first dielectric material 146 across the memory array region 111 and the staircase region 113 of an individual block 110 of the stack structure 102 may follow (e.g., imitate) the non-planar topography of an upper surface of the block 110 (and the non-planar topography of an upper surface of the isolation material 134 formed thereover) accounting for and influenced by the dished section 136 of the block 110. In addition, the topography of the first dielectric material 146 may also account for and be influenced by the newly unfilled portions of the slots 112 (FIG. 6) previously formed at the processing stage previously described with reference to FIG. 6. For example, referring to FIG. 7B, a topography of upper vertical boundaries and lower vertical boundaries of the first dielectric material 146 may account for and be influenced by the newly unfilled portions of slots 112 (FIG. 6) previously formed at the processing stage previously described with reference to FIG. 6.

A thickness of the first dielectric material 146 may be selected such that a combined thickness of the first dielectric material 146 and a second dielectric material (as described in further detail below, if any) subsequently formed thereon or thereover is greater than a maximum vertical offset between different portions of an uppermost tier 108 of the stack structure 102 imparted by the dished section 136 of an individual block 110 of the stack structure 102. A combined thickness of the first dielectric material 146 and the second dielectric material (if any) to subsequently be formed may, for example, be selected to be within a range of from about 1.5 times (1.5×) to about 3 times (X) (e.g., from about 1.75 times (1.75×) to about 2.75 times (2.75×), from about 2.0 times (2.0×) to about 2.5 times (2.5×)) greater than the maximum vertical offset between the different portions of the uppermost tier 108 of the stack structure 102 imparted by the dished section 136 of the block 110. As a non-limiting example, if because of the dished section 136 of an individual block 110, a portion of an upper surface of an uppermost tier 108 within the staircase region 113 of the block 110 vertically underlies an additional portion of the upper surface of the uppermost tier 108 within the memory array region 111 of the block 110 by vertical offset (e.g., vertical distance) is about 200 nm, a combined thickness of the first dielectric material 146 and the second dielectric material (if any) to subsequently be formed may be selected to be within a range of from about 300 nm to about 600 nm. The first dielectric material 146 may, for example, be formed to have a thickness within a range of from about 100 nm to about 500 nm, such as from about 100 nm to about 400 nm, from about 200 nm to about 400 nm, from about 100 nm to about 300 nm, from about 200 nm to about 300 nm, or from about 100 nm to about 200 nm. In some embodiments, the first dielectric material 146 is formed to have a thickness within a range of from about 100 nm to about 300 nm.

With continued reference to FIG. 7B, filled slot structures 148 may individually include the dielectric liner material 137, one of the fill structures 144, and a portions (e.g., a projecting portion) of the first dielectric material 146. The dielectric liner material 137 may substantially cover horizontal boundaries (e.g., side surfaces) and a lower vertical boundary (e.g., a lower surface) of the fill structure 144, as well as horizontal boundaries (e.g., side surfaces) of the portion of the first dielectric material 146; and the portion of the first dielectric material 146 may substantially cover an upper vertical boundary (e.g., an upper surface) of the fill structure 144. The filled slot structures 148 may vertically extend completely through the isolation material 134 and each of the tiers 108 of the stack structure 102, and to or into the source tier 114 vertically underlying the stack structure 102.

Discernable (e.g., observable) interfaces may be exhibited between the first dielectric material 146 and each of the isolation material 134, the dielectric liner material 137, and the fill structures 144. Such discernable interfaces may be exhibited even if the first dielectric material 146 and one or more of isolation material 134, the dielectric liner material 137, and the fill structures 144 have the same material composition as one another, as a result of differences in the processes (e.g., material deposition processes, such as ALD processes, CVD processes, PECVD processes) employed to form the first dielectric material 146 relative to the one or more of the isolation material 134, the dielectric liner material 137, and the fill structures 144. For example, even if the dielectric liner material 137, the isolation material 134, and the first dielectric material 146 are each formed of and include $SiO_2$, discernable interfaces may be exhibited between the first dielectric material 146, the isolation material 134, and the dielectric liner material 137 as a result of different processing employed to form the first dielectric material 146, the isolation material 134, and the dielectric liner material 137. In some embodiments, the dielectric liner material 137 is formed through an ALD process; the isolation material 134 is formed through a CVD process employing tetraethoxysilane (TEOS) as a precursor; and the first dielectric material 146 is formed through a high aspect ratio process (HARP) (e.g., a thermal, non-plasma-based CVD process).

Figure 8A:
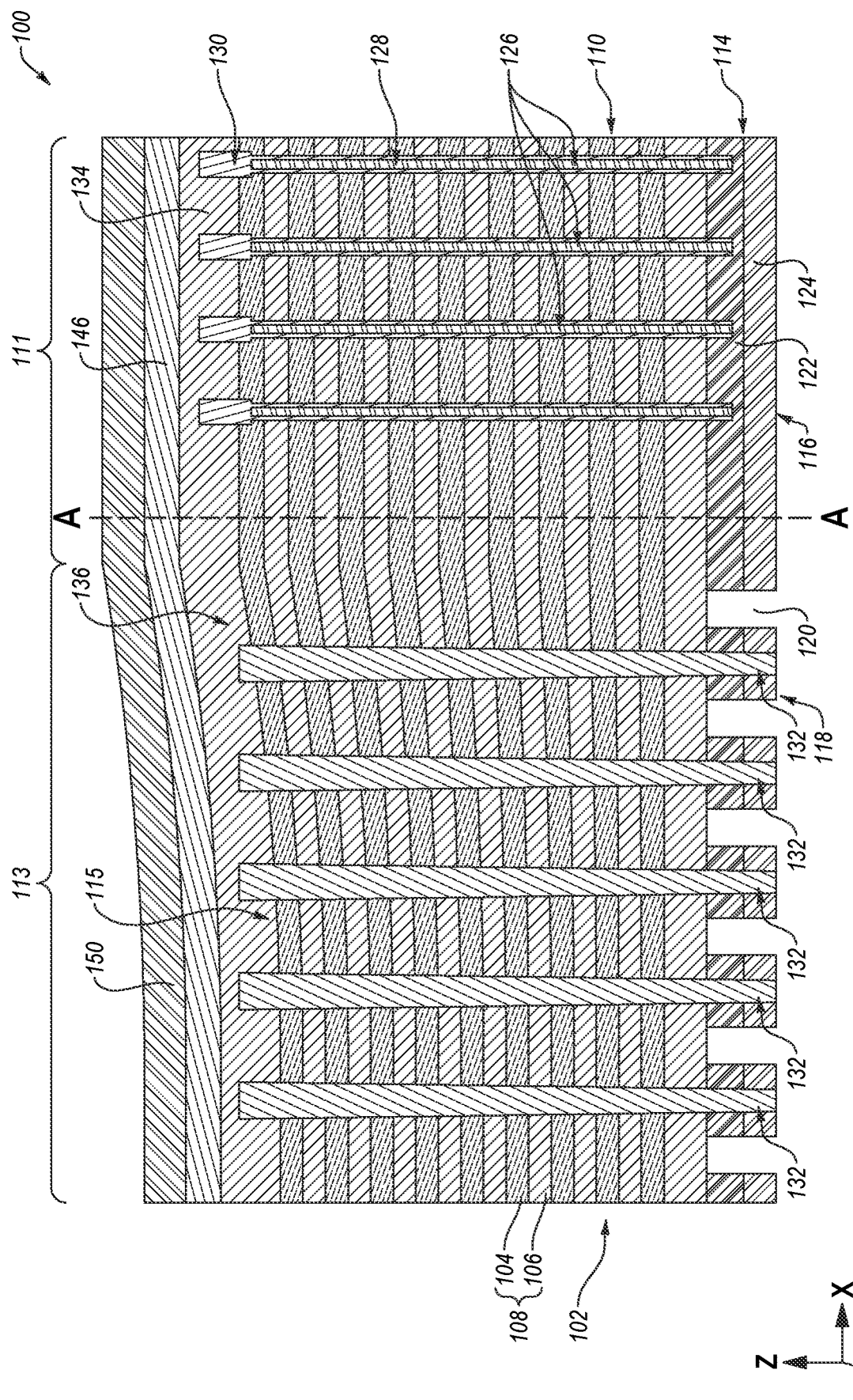
FIG. 8A is a simplified, longitudinal cross-sectional view of the portion of the microelectronic device structure shown in FIG. 7A at another processing stage of the method of forming the microelectronic device following the processing stage of FIGS. 7A and 7B.
Figure 8B:
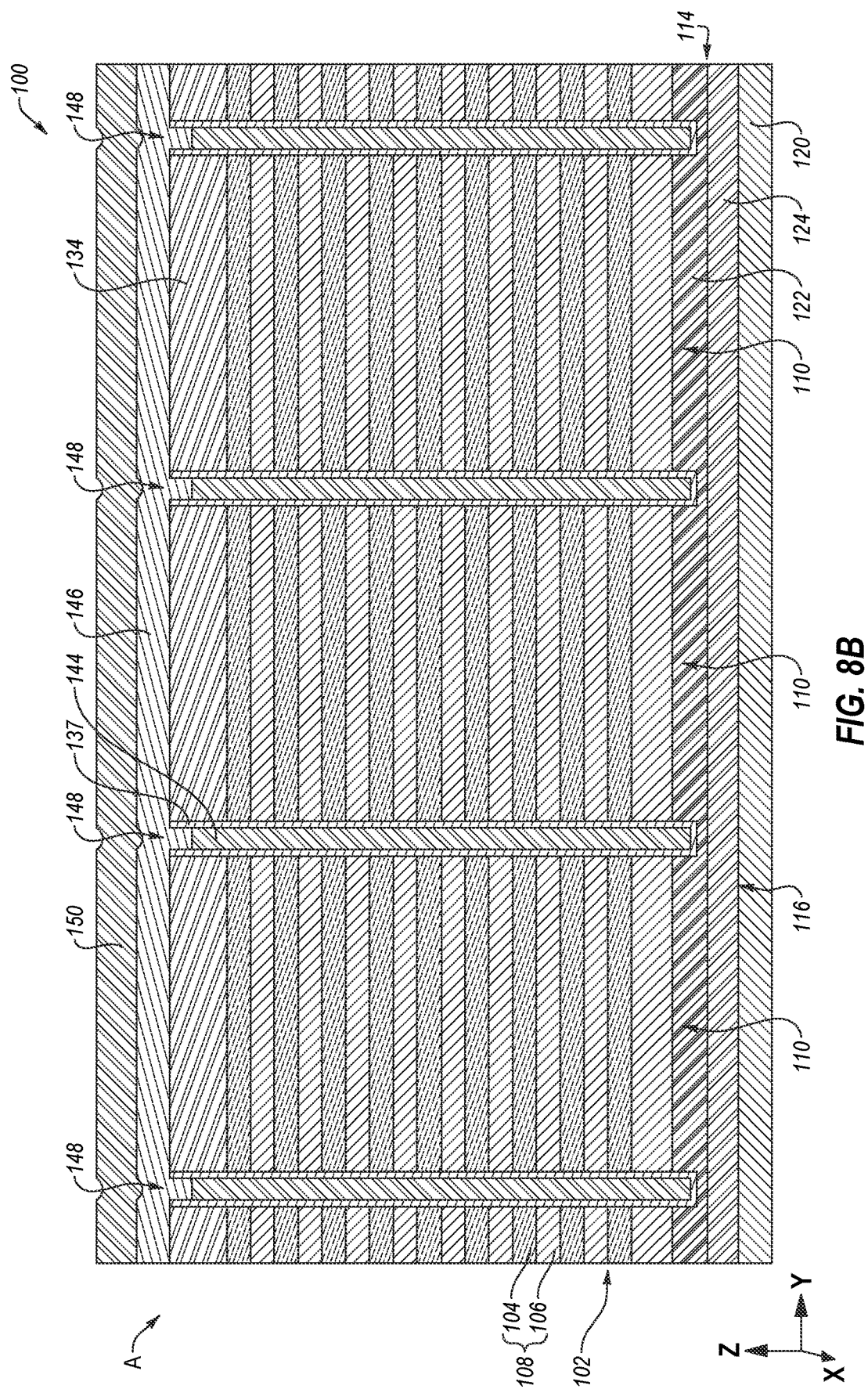
FIG. 8B is a simplified, longitudinal cross-sectional view of the portion A of the microelectronic device structure at the processing stage of FIG. 8A, wherein the portion A is represented by the dashed line A-A shown in FIG. 8A.

FIG. 8A is a simplified, longitudinal cross-sectional view of the portion of the microelectronic device structure 100 shown in FIG. 7A following the processing stage previously described with reference to FIGS. 7A and 7B. FIG. 8B is a simplified, longitudinal cross-sectional view of the portion A of the microelectronic device structure 100 at the processing stage of FIG. 8A, wherein the portion A is represented by the dashed line A-A shown in FIG. 8A. Referring collectively to FIGS. 8A and 8B, a second dielectric material 150 may be formed on or over the first dielectric material 146. The second dielectric material 150 may substantially continuously horizontally extend across and between the blocks 110 of the stack structure 102, including across the memory array regions 111 (FIG. 8A) and the staircase regions 113 (FIG. 8A) of the blocks 110.

The second dielectric material 150 may be formed of and include at, least one dielectric material, such as a one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, and $TiO_x$), at least one dielectric nitride material (e.g., $SiN_y$), at least one dielectric oxynitride material (e.g., $SiO_xN_y$), and at least one dielectric carboxynitride material (e.g., $SiO_xC_zN_y$). A material composition of the second dielectric material 150 may be substantially the same as a material composition of the first dielectric material 146, but the second dielectric material 150 may be formed using a different material deposition process than the first dielectric material 146; or the material composition of the second dielectric material 150 may be different than the material composition of the first dielectric material 146. In some embodiments, the second dielectric material 150 is formed of and includes a dielectric oxide material (e.g., $SiO_x$, such as $SiO_2$) formed through a material deposition process (e.g., a CVD process, an ALD process) employing tetraethoxysilane (TEOS) as a precursor. Such a dielectric oxide material is also referred to herein as a TEOS oxide. In additional embodiments, the second dielectric material 150 is formed of and includes dielectric oxide material (e.g., $SiO_x$, such as $SiO_2$) formed by way of a different ALD process or a different CVD process. In further embodiments, if the first dielectric material 146 has been formed to a sufficient thickness to mitigate the subsequent processing difficulties (e.g., subsequent photolithography processing difficulties) imparted the dished sections 136 of the blocks 110, the second dielectric material 150 is not formed at all.

The second dielectric material 150 may at least partially (e.g., substantially) conform to a topography defined by the upper surface of the first dielectric material 146. For example, still referring collectively to FIGS. 8A and 8B, a topography of upper vertical boundaries and lower vertical boundaries of the second dielectric material 150 across the memory array region 111 and the staircase region 113 of an individual block 110 of the stack structure 102, and between neighboring blocks 110 of stack structure 102 (e.g., across the filled slot structures 148 (FIG. 8B)), may follow (e.g., imitate) a non-planar topography of an upper surface of the first dielectric material 146.

As previously discussed in relation to the first dielectric material 146, a thickness of the second dielectric material 150 may be selected such that a combined thickness of the first dielectric material 146 and the second dielectric material 150 is greater than a maximum vertical offset between different portions of an uppermost tier 108 of the stack structure 102 imparted by the dished section 136 of an individual block 110 of the stack structure 102. In some embodiments, a combined thickness of the first dielectric material 146 and the second dielectric material 150 is selected to be greater than or equal to about 300 nm, such as greater than or equal to about 400 nm (e.g., within a range of from about 400 nm to about 600 nm), or greater than or equal to about 500 nm (e.g., within a range of from about 500 nm to about 600 nm). The second dielectric material 150 may, for example, be formed to have a thickness within a range of from about 100 nm to about 500 nm, such as from about 100 nm to about 400 nm, from about 200 nm to about 400 nm, from about 100 nm to about 300 nm, from about 200 nm to about 300 nm, or from about 100 nm to about 200 nm. In some embodiments, the second dielectric material 150 is formed to have a thickness within a range of from about 200 nm to about 400 nm.

Discernable (e.g., observable) interfaces may be exhibited between the second dielectric material 150 and the first dielectric material 146. Such discernable interfaces may be exhibited even if the second dielectric material 150 and the first dielectric material 146 have the same material composition as one another, as a result of differences in the processes (e.g., material deposition processes, such as ALD processes, CVD processes, PECVD processes) employed to form the second dielectric material 150 and the first dielectric material 146. For example, even if the second dielectric material 150 and the first dielectric material 146 are each formed of and include $SiO_2$, discernable interfaces may be exhibited between the second dielectric material 150 and the first dielectric material 146 as a result of different processing employed to form the second dielectric material 150 and the first dielectric material 146. In some embodiments, the first dielectric material 146 is formed through a high aspect ratio process (HARP) (e.g., a thermal, non-plasma-based CVD process), and the second dielectric material 150 is formed through a CVD process employing TEOS as a precursor. For example, the first dielectric material 146 may be a HARP oxide, and the second dielectric material 150 may be a TEOS oxide.

Forming the second dielectric material 150 on or over the first dielectric material 146 may be advantageous at least in terms of processing time and efficiency. However, as previously described herein, if the first dielectric material 146 is formed to a sufficient vertical height (e.g., equivalent to the combined vertical height of the first dielectric material 146 and second dielectric material 150 previously described herein) greater than the maximum vertical offset between different portions of an uppermost tier 108 of the stack structure 102 imparted by the dished section 136 of an individual block 110 of the stack structure 102, the formation of the second dielectric material 150 may be omitted. As a non-limiting example, rather than forming the first dielectric material 146 and the second dielectric material 150 to have a combined thickness of about 500 nm (or another suitable thickness selected based, at least partially, on the configurations of the dished sections 136 of the blocks 110 of the stack structure 102), the first dielectric material 146 may alone be formed to a thickness of about 500 nm.

Figure 9A:
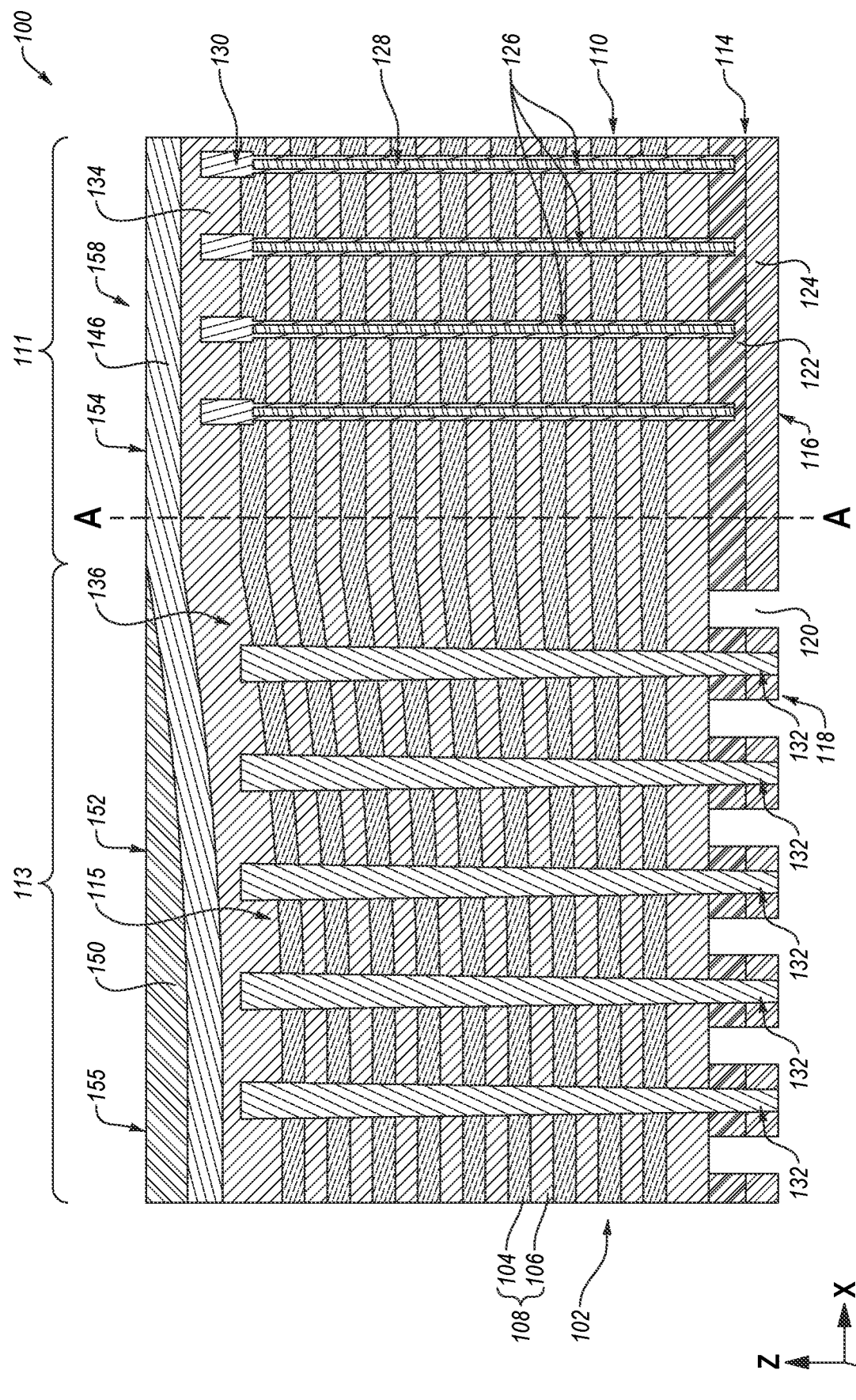
FIG. 9A is a simplified, longitudinal cross-sectional view of the portion of the microelectronic device structure shown in FIG. 8A at another processing stage of the method of forming the microelectronic device following the processing stage of FIGS. 8A and 8B.
Figure 9B:
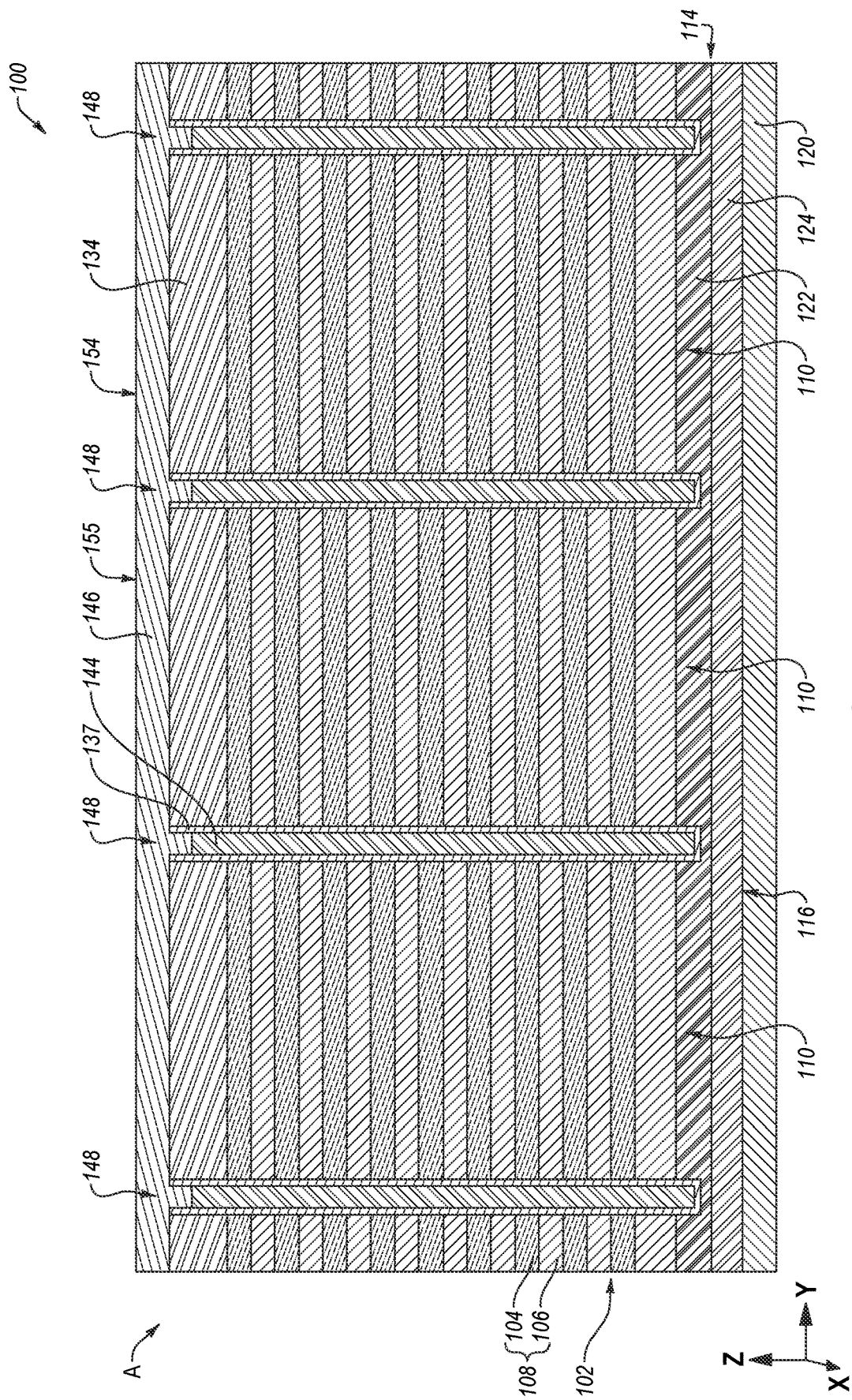
FIG. 9B is a simplified, longitudinal cross-sectional view of the portion A of the microelectronic device structure at the processing stage of FIG. 9A, wherein the portion A is represented by the dashed line A-A shown in FIG. 9A.

FIG. 9A is a simplified, longitudinal cross-sectional view of the portion of the microelectronic device structure 100 shown in FIG. 8A following the processing stage previously described with reference to FIGS. 8A and 8B. FIG. 9B is a simplified, longitudinal cross-sectional view of the portion A of the microelectronic device structure 100 at the processing stage of FIG. 9A, wherein the portion A is represented by the dashed line A-A shown in FIG. 9A. Referring collectively to FIGS. 9A and 9B, the microelectronic device structure 100 may be subjected to at least one additional material removal process (e.g., at least one planarization process, such as at least one CMP process) to reduce thicknesses of the second dielectric material 150 and the first dielectric material 146. Following the material removal process, a remaining (e.g., unremoved) portion of the second dielectric material 150 (FIG. 9A) may exhibit an upper surface 152 substantially coplanar with an upper surface 154 of a remaining (e.g., unremoved) portion of the first dielectric material 146.

The additional material removal process may effectuate the formation of a substantially planar upper surface 155 of the microelectronic device structure 100, as defined by a combination of the upper surface 152 of the remaining portion of the second dielectric material 150 and the upper surface 154 of the remaining portion of the first dielectric material 146. Forming the substantially planar upper surface 155 of the microelectronic device structure 100 may mitigate subsequent processing difficulties (e.g., photolithography patterning difficulties, such as depth of focus difficulties and/or feature positioning difficulties) that may otherwise result from the dished sections 136 of the blocks 110 in the absence of the forming with substantially planar upper surface 155 in accordance with the methods of the disclosure.

How much (e.g., amounts, volumes) of the second dielectric material 150 and the first dielectric material 146 is removed by way of the additional material removal process (and, hence, how much of and where the second dielectric material 150 and the first dielectric material 146 remain following the additional material removal process) may at least partially depend on the configurations (e.g., dimensions) of the dished sections 136 of the blocks 110 and on the combined thickness of the second dielectric material 150 and the first dielectric material 146 prior to the additional material removal process. The substantially planar upper surface 155 of the microelectronic device structure 100, as defined by the upper surface 152 of the remaining portion of the second dielectric material 150 and the upper surface 154 of the remaining portion of the first dielectric material 146, may completely vertically overlie an uppermost vertical boundary (e.g., an upper surface) of the isolation material 134 following the additional material removal process. Put another way, the additional material removal process may not expose the isolation material 134. In some embodiments, additional material removal process vertically thins the combination of the second dielectric material 150 and the first dielectric material 146 by a vertical height within a range of from about 200 nm to about 600, such as from about 250 nm to about 550 nm, from about 300 nm to about 500 nm, or from about 350 nm to about 450 nm. By way of non-limiting example, if a combined thickness of the second dielectric material 150 and the first dielectric material 146 is about 500 nm, the additional material removal process may result in the substantially planar upper surface 155 of the microelectronic device structure 100 being formed to be from about 350 nm to about 450 nm (e.g., about 400 nm) vertically lower than a previous uppermost vertical boundary of the second dielectric material 150. The previous uppermost vertical boundary of the second dielectric material 150 may, for example, correspond to a vertical position (e.g., vertical elevation) of one or more portions of an upper surface of the second dielectric material 150 outside of the horizontal areas of the dished sections 136 of the blocks 110 of the stack structure 102.

Following the additional material removal process, the remaining portion of the first dielectric material 146 may still substantially cover and substantially continuously horizontally extend across and between the blocks 110 of the stack structure 102. As shown in FIG. 9A, within a horizontal area of an individual block 110 of the stack structure 102, a thickness of the remaining portion of the first dielectric material 146 within horizontal boundaries of the memory array region 111 of the block 110 may be less than a thickness of the remaining portion of the first dielectric material 146 within horizontal boundaries of the staircase region 113 of the block 110. For example, within a horizontal area of the dished section 136 of the block 110 at least partially located within horizontal boundaries of the staircase region 113 of the block 110, the remaining portion of the first dielectric material 146 may exhibit a thickness substantially equal to an as-deposited thickness of the first dielectric material 146 (e.g., a thickness before the processing stage described with reference to FIGS. 9A and 9B); but within a horizontal area of the memory array region 111 of the block 110, the remaining portion of the first dielectric material 146 may exhibit a different thickness less than the as-deposited thickness of the first dielectric material 146.

Following the additional material removal process, the remaining portion of the second dielectric material 150 may less than substantially cover the blocks 110 of the stack structure 102. For example, as shown in FIG. 9A, following the additional material removal process the microelectronic device structure 100 may be substantially free of the second dielectric material 150 within horizontal areas of the memory array regions 111 of the blocks 110. The remaining portion of the second dielectric material 150 may substantially cover horizontal areas of the dished sections 136 of the blocks 110 at least partially located within horizontal boundaries of the staircase regions 113 of the blocks 110, but may not horizontally extend into the horizontal areas of the memory array regions 111 of the blocks 110. The remaining portion of the second dielectric material 150 may also continuously horizontally extend (e.g., in the Y-direction) between the horizontal areas of the dished sections 136 of blocks 110 horizontally neighboring one another (e.g., in the Y-direction).

Figure 10A:
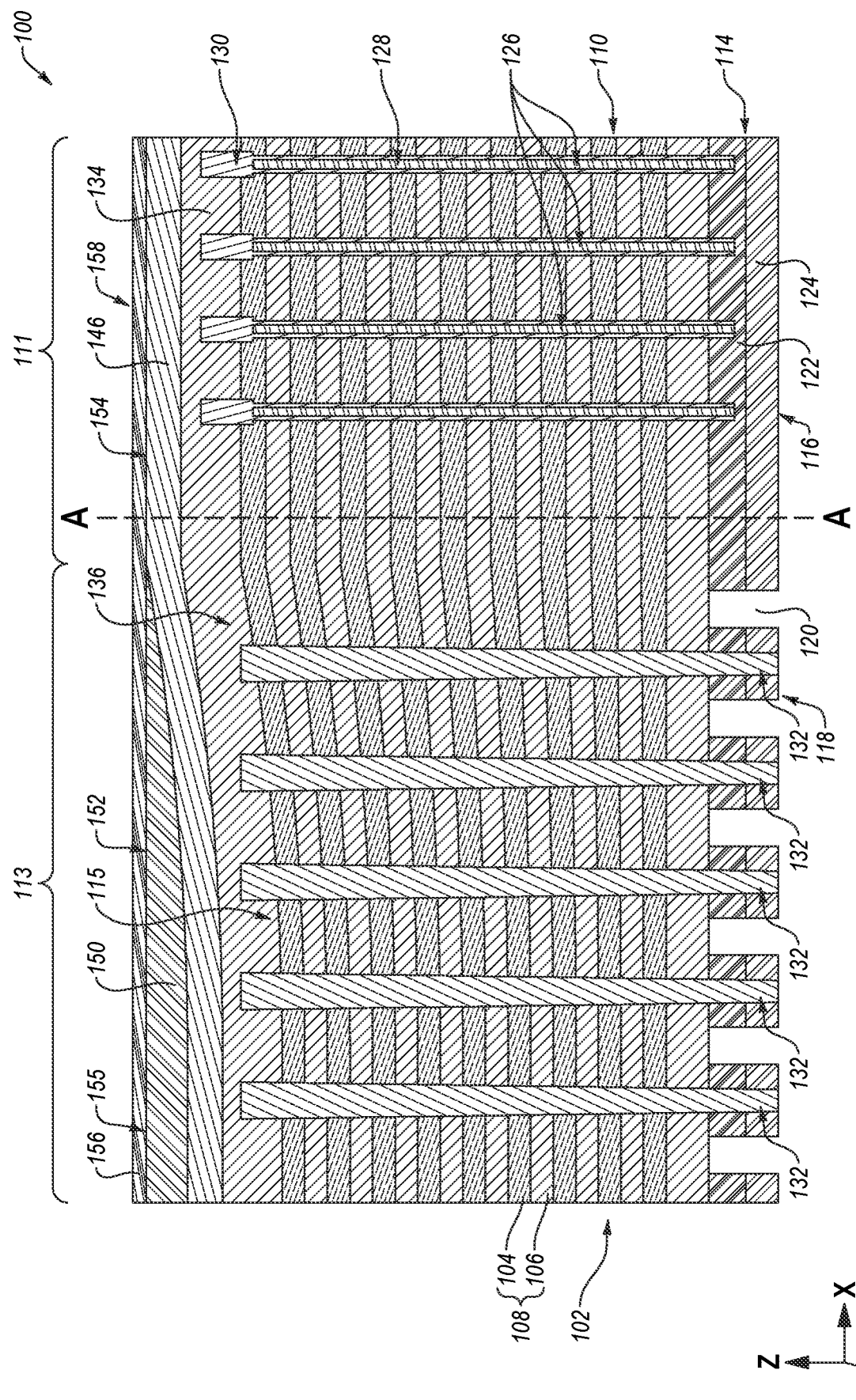
FIG. 10A is a simplified, longitudinal cross-sectional view of the portion of the microelectronic device structure shown in FIG. 9A at another processing stage of the method of forming the microelectronic device following the processing stage of FIGS. 9A and 9B.
Figure 10B:
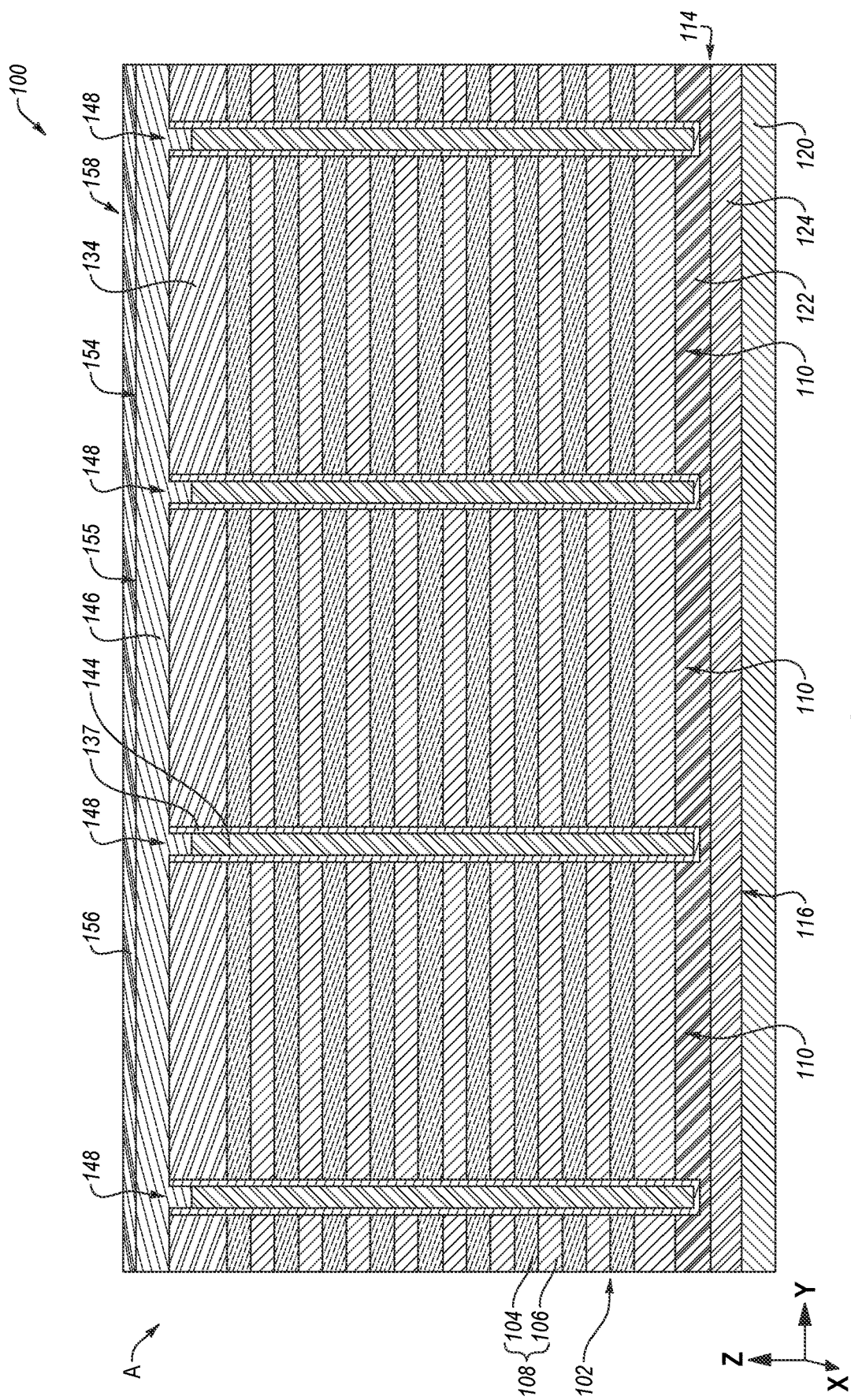
FIG. 10B is a simplified, longitudinal cross-sectional view of the portion A of the microelectronic device structure at the processing stage of FIG. 10A, wherein the portion A is represented by the dashed line A-A shown in FIG. 10A.

FIG. 10A is a simplified, longitudinal cross-sectional view of the portion of the microelectronic device structure 100 shown in FIG. 9A following the processing stage previously described with reference to FIGS. 9A and 9B. FIG. 10B is a simplified, longitudinal cross-sectional view of the portion A of the microelectronic device structure 100 at the processing stage of FIG. 10A, wherein the portion A is represented by the dashed line A-A shown in FIG. 10A. Referring collectively to FIGS. 10A and 10B, the microelectronic device structure 100 may be subjected to at least one additional processing, including the formation of a third dielectric material 156 on or over exposed surfaces of the remaining portions of the first dielectric material 146 and the second dielectric material 150. The third dielectric material 156 may, for example, be formed to substantially cover the substantially planar upper surface 155 (as defined by the upper surface 152 of the remaining portion of the second dielectric material 150 and the upper surface 154 of the remaining portion of the first dielectric material 146) of the microelectronic device structure 100 formed at the processing stage previously described with reference to FIGS. 9A and 9B.

In some embodiments, following the processing stage previously described herein with reference to FIGS. 9A and 9B, the microelectronic device structure 100 is subjected to at least one photolithographic patterning process to form additional slots partially vertically extending into the blocks 110 of the stack structure 102. The additional slots may, for example, only vertically extend into an upper group of the tiers 108, such as less than or equal to ten (10) (e.g., less than or equal to eight (8), less than or equal to six (6), less than or equal to four (4)) of the relatively vertically highest tiers 108 within the stack structure 102. Within an individual block 110, the conductive material 104 of such an upper group of the tiers 108 may be employed to form select gate structures (SGD structures). The additional slots may partition the conductive material 104 of each tier 108 of the upper group of the tiers 108 to form a desired quantity of select gate structures in each tier 108 of the upper group of the tiers 108. The processing stages of the disclosure previously described herein may mitigate challenges (e.g., depth of focus challenges, additional slot positioning challenges) that may otherwise result from the dished sections 136 of the blocks 110 during such a photolithographic patterning process if the processing stages of the disclosure previously described herein were not performed in advance of the photolithographic patterning process. Following the formation of the additional slots, the third dielectric material 156 may be formed over surfaces of the microelectronic device structure 100 inside and outside of boundaries of the additional slots. The third dielectric material 156 may substantially fill the additional slots, and may also substantially cover exposed surfaces of the remaining portions of the first dielectric material 146 and the second dielectric material 150 outside of the additional slots.

The third dielectric material 156 may be formed of and include at least one dielectric material, such as a one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, and $TiO_x$), at least one dielectric nitride material (e.g., $SiN_y$), at least one dielectric oxynitride material (e.g., $SiO_xN_y$), and at least one dielectric carboxynitride material (e.g., $SiO_xC_zN_y$). A material composition of the third dielectric material 156 may be substantially the same as a material composition of the second dielectric material 150, but the third dielectric material 156 may be formed using a different material deposition process than the second dielectric material 150; or the material composition of the third dielectric material 156 may be different than the material composition of the second dielectric material 150. In some embodiments, the third dielectric material 156 is formed of and includes a dielectric oxide material (e.g., $SiO_x$, such as $SiO_2$) formed through an ALD process. Such a dielectric oxide material is also referred to herein as an ALD oxide.

Referring collectively to FIGS. 10A and 10B, the third dielectric material 156 may be formed to exhibit a substantially planar upper surface 158. In some embodiments, a lower vertical boundary of the third dielectric material 156 is at least partially non-planar. For example, if the third dielectric material 156 is employed to fill additional slots formed after the processing stage previously described herein with reference to FIGS. 9A and 9B, a lower vertical boundary of the third dielectric material 156 may be substantially non-planar. In some embodiments, at least one planarization process (e.g., at least one CMP process) is performed to form the substantially planar upper surface 158 of the third dielectric material 156. For example, a preliminary volume of the third dielectric material 156 may be deposited, and then the preliminary volume of the third dielectric material 156 may be subjected to a CMP process to form the substantially planar upper surface 158.

The third dielectric material 156 may be formed to exhibit a desired thickness on the substantially planar upper surface 155 (as defined by the upper surface 152 of the remaining portion of the second dielectric material 150 and the upper surface 154 of the remaining portion of the first dielectric material 146) of the microelectronic device structure 100. By way of non-limiting example, the third dielectric material 156 may be formed to exhibit a thickness within a range of from about 10 nm to about 5000 nm, such as from about 100 nm to about 5000 nm, from about 100 nm to about 1000 nm, or from about 100 nm to about 500 nm.

Discernable (e.g., observable) interfaces may be exhibited between the third dielectric material 156 and the remaining portions of the first dielectric material 146 and the second dielectric material 150. Such discernable interfaces may be exhibited even if the first dielectric material 146, the second dielectric material 150, and the third dielectric material 156 have the same material composition as one another, as a result of differences in the processes (e.g., material deposition processes, such as ALD processes, CVD processes, PECVD processes) employed to form the first dielectric material 146, the second dielectric material 150, and the third dielectric material 156. For example, even if the first dielectric material 146, the second dielectric material 150, and the third dielectric material 156 are each formed of and include $SiO_2$, discernable interfaces may be exhibited between the third dielectric material 156 and remaining portions of the first dielectric material 146 and the second dielectric material 150 as a result of different processing employed to form the first dielectric material 146, the second dielectric material 150, and the third dielectric material 156.

Thus, in accordance with embodiments of the disclosure, a method of forming a microelectronic device comprises forming a stack structure comprising a vertically alternating sequence of conductive material and insulative material arranged in tiers. The stack structure is divided into blocks separated from one another by slots. At least one of the blocks comprises a memory array region having vertically extending strings of memory cells within a horizontal area thereof; and a staircase region horizontally neighboring the memory array region and comprising a crest sub-region horizontally interposed between a staircase structure and the memory array region. An uppermost boundary of the tiers within the crest sub-region vertically underlie an uppermost boundary of the tiers within the memory array region. Dielectric liner material is formed within the slots. The dielectric liner material substantially covers surfaces of the blocks partially defining horizontal boundaries of the slots. Fill structures are formed within the slots. The fill structures are horizontally surrounded by the dielectric liner material and have upper surfaces below upper boundaries of the slots. Dielectric material is formed to horizontally extend substantially continuously over and between the blocks. The dielectric material substantially fills remaining portions of the slots to form filled slot structures. An upper portion of the dielectric material is removed. A remaining portion of the dielectric material overlies the crest sub-region of the staircase region of the at least one of the blocks and has a greater vertical thickness than an additional remaining portion of the dielectric material overlying the memory array region of the at least one of the blocks.

Figure 11:
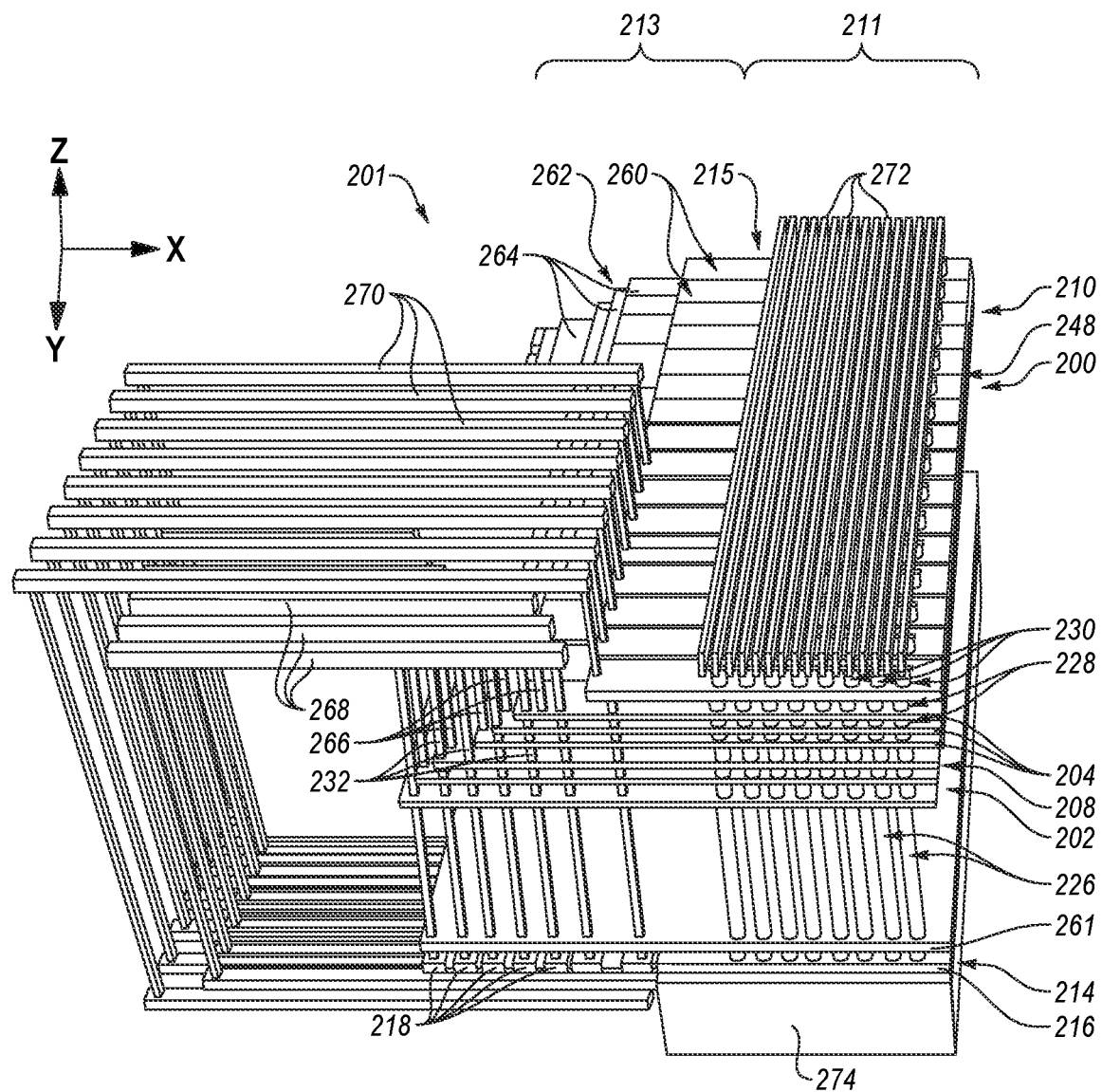
FIG. 11 is a simplified partial cutaway perspective view of a microelectronic device, in accordance with embodiments of the disclosure.

Microelectronic device structures (e.g., the microelectronic device structure 100 following the processing stage previously described with reference to FIGS. 10A and 10B) of the disclosure may be included in microelectronic devices of the disclosure. For example, FIG. 11 illustrates a partial cutaway perspective view of a portion of a microelectronic device 201 (e.g., a memory device, such as a 3D NAND Flash memory device) including a microelectronic device structure 200. The microelectronic device structure 200 may be substantially similar to the microelectronic device structure 100 with reference to FIGS. 10A and 10B. To avoid repetition, not all features (e.g., structures, materials, regions, devices) shown in FIG. 11 are described in detail herein. Rather, unless described otherwise below, in FIG. 11, a feature designated by a reference numeral that is a 100 increment of the reference numeral of a feature previously described with reference to the microelectronic device structure 100 (FIGS. 10A and 10B) will be understood to be substantially similar to the previously described feature. By way of non-limiting example, unless described otherwise below, features designated by the reference numerals 202, 210, and 248 in FIG. 11 respectively will be understood to be substantially similar to the stack structure 102, the blocks 110, and the filled slot structures 148 previously described herein with reference to FIGS. 10A and 10B. In addition, for clarity and ease of understanding the drawings and associated description, some features (e.g., structures, materials, regions, devices) of the microelectronic device structure 100 previously described herein are not shown in FIG. 11. However, it will be understood that any features of the microelectronic device structure 100 previously described with reference to FIGS. 10A and 10B may be included in the microelectronic device structure 200 of the microelectronic device 201 described herein with reference to FIG. 11.

As shown in FIG. 11, in addition to the features of the microelectronic device structure 200 previously described herein in relation to the microelectronic device structure 100 (FIGS. 10A and 10B), the microelectronic device 201 may further include staircase structures 262 within the staircase regions 213 of the blocks 210 of the stack structure 202. The staircase structures 262 of the blocks 210 may individually include steps 264 defined by horizontal ends (e.g., edges) of the tiers 208 of the stack structure 202. The steps 264 have treads (e.g., upper surfaces) defining contact regions for the conductive material 204 of the tiers 208 of the stack structure 202.

The microelectronic device 201 may further include access line routing structures 268, first select gates 260 (e.g., upper select gates, drain select gates (SGDs)), select line routing structures 270, one or more second select gates 261 (e.g., lower select gates, source select gate (SGSs)), additional contact structures 266 (e.g., access line contact structures, select line contact structures), and digit line structures 272. The digit line structures 272 may vertically overlie and be coupled to the pillar structures 226 (and, hence, the strings of memory cells 228). In addition, the additional contact structures 266 may couple various features of the microelectronic device 201 to one another as shown (e.g., the select line routing structures 270 to the first select gates 260; the access line routing structures 268 to the conductive materials 204 of the tiers 208 of the stack structure 202 underlying the first select gates 260 and defining access line structures of the microelectronic device 201).

The microelectronic device 201 may also include a base structure 274 positioned vertically below the pillar structures 226 (and, hence, the strings of memory cells 228). The base structure 274 may include at least one control logic region including control logic devices configured to control various operations of other features (e.g., the strings of memory cells 228) of the microelectronic device 201. As a non-limiting example, the control logic region of the base structure 274 may further include one or more (e.g., each) of charge pumps (e.g., $V_{CCP}$ charge pumps, $V_{NEGWL}$ charge pumps, DVC2 charge pumps), delay-locked loop (DLL) circuitry (e.g., ring oscillators), $V_{dd}$ regulators, drivers (e.g., string drivers), page buffers, decoders (e.g., local deck decoders, column decoders, row decoders), sense amplifiers (e.g., equalization (EQ) amplifiers, isolation (ISO) amplifiers, NMOS sense amplifiers (NSAs), PMOS sense amplifiers (PSAs)), repair circuitry (e.g., column repair circuitry, row repair circuitry), I/O devices (e.g., local I/O devices), memory test devices, MUX, error checking and correction (ECC) devices, self-refresh/wear leveling devices, and other chip/deck control circuitry. The control logic region of the base structure 274 may be coupled to the source structure 216, the access line routing structures 268, the select line routing structures 270, and the digit line structures 272. In some embodiments, the control logic region of the base structure 274 includes CMOS (complementary metal-oxide-semiconductor) circuitry. In such embodiments, the control logic region of the base structure 274 may be characterized as having a "CMOS under Array" ("CuA") configuration.

Thus, in accordance with embodiments of the disclosure, a microelectronic device comprises a stack structure, filled slot structures, and dielectric material. The stack structure comprising blocks each including a vertically alternating sequence of conductive material and insulative material arranged in tiers. At least one of the blocks comprises a memory array region and a staircase region horizontally neighboring the memory array region. The memory array region has vertically extending strings of memory cells within a horizontal area thereof. The staircase region comprises a staircase structure having steps including horizontal ends of the tiers, and a crest sub-region horizontally interposed between the staircase structure and the memory array region. An uppermost boundary of the tiers within the crest sub-region vertically underlie an uppermost boundary of the tiers within the memory array region. The filled slot structures are interposed between the blocks of the stack structure. The dielectric material substantially continuously horizontally extends over and between the blocks of the stack structure. A vertical thickness of a portion of the dielectric material overlying the crest sub-region of the staircase region of the at least one of the blocks is greater than a vertical thickness of an additional portion of the dielectric material overlying the memory array region of the at least one of the blocks.

Furthermore, in accordance with embodiments of the disclosure, a memory device comprises a stack structure, filled slot structures, a first dielectric material, and a second dielectric material. The stack structure comprises blocks including tiers each comprising conductive material vertically adjacent insulative material. Each of the blocks comprises a memory array region, and a staircase region neighboring the memory array region in a first horizontal direction. The memory array region includes strings of memory cells vertically extending through some of the tiers. The staircase region comprises a staircase structure having steps comprising edges of the tiers, and an elevated sub-region interposed between a top of the staircase structure and the memory array region in the first horizontal direction. A portion of an upper surface of uppermost one of the tiers within the memory array region vertically overlies an additional portion of the upper surface of the uppermost one of the tiers within the elevated sub-region. The filled slot structures are interposed between the blocks of the stack structure in a second horizontal direction orthogonal to the first horizontal direction. The first dielectric material substantially continuously horizontally extends over and between the blocks of the stack structure. A vertical height of a first portion of the first dielectric material within a horizontal area of the elevated sub-region of the staircase region of each of the blocks is greater than a vertical height of a second portion of the first dielectric material within a horizontal area of the memory array region of each of the blocks. A second dielectric material is on the first portion of the first dielectric material. An upper boundary of the second dielectric material is substantially coplanar with an upper boundary of the second portion of the first dielectric material.

Microelectronic devices structures (e.g., the microelectronic device structure 100 previously described with reference to FIGS. 10A and 10B) and microelectronic devices (e.g., the microelectronic device 201 (FIG. 11)) in accordance with embodiments of the disclosure may be used in embodiments of electronic systems of the disclosure. For example, FIG. 12 is a block diagram of an illustrative electronic system 303 according to embodiments of disclosure. The electronic system 303 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPad® or SURFACE® tablet, an electronic book, a navigation device, etc. The electronic system 303 includes at least one memory device 305. The memory device 305 may comprise, for example, one or more of a microelectronic device structure (e.g., the microelectronic device structure 100 previously described with reference to FIGS. 10A and 10B) and a microelectronic device (e.g., the microelectronic device 201 (FIG. 11)) previously described herein. The electronic system 303 may further include at least one electronic signal processor device 307 (often referred to as a "microprocessor"). The electronic signal processor device 307 may, optionally, include one or more of a microelectronic device structure (e.g., the microelectronic device structure 100 previously described with reference to FIGS. 10A and 10B) and a microelectronic device (e.g., the microelectronic device 201 (FIG. 11)) previously described herein. While the memory device 305 and the electronic signal processor device 307 are depicted as two (2) separate devices in FIG. 12, in additional embodiments, a single (e.g., only one) memory/processor device having the functionalities of the memory device 305 and the electronic signal processor device 307 is included in the electronic system 303. In such embodiments, the memory/processor device may include one or more of a microelectronic device structure (e.g., the microelectronic device structure 100 previously described with reference to FIGS. 10A and 10B) and a microelectronic device (e.g., the microelectronic device 201 (FIG. 11)) previously described herein. The electronic system 303 may further include one or more input devices 309 for inputting information into the electronic system 303 by a user, such as, for example, a mouse or other pointing device, a keyboard, a touchpad, a button, or a control panel. The electronic system 303 may further include one or more output devices 311 for outputting information (e.g., visual or audio output) to a user such as, for example, a monitor, a display, a printer, an audio output jack, a speaker, etc. In some embodiments, the input device 309 and the output device 311 comprise a single touchscreen device that can be used both to input information to the electronic system 303 and to output visual information to a user. The input device 309 and the output device 311 may communicate electrically with one or more of the memory devices 305 and the electronic signal processor device 307.

Thus, in accordance with embodiments of the disclosure, an electronic system comprises an input device, an output device, a processor device operably coupled to the input device and the output device, and a memory device operably coupled to the processor device. The memory device comprises at least one microelectronic device structure comprising a stack structure, isolation material, filled slot structures, and dielectric oxide material. The stack structure comprises blocks including tiers each comprising conductive material vertically adjacent insulative material. Each of the blocks comprises an array region including vertically extending strings of memory cells; and a staircase region neighboring the array region and comprising a crest sub-region horizontally interposed between a staircase structure and the array region. An upper boundary of an uppermost one the tiers within the crest sub-region is below an upper boundary of the uppermost one the tiers within the array region. The isolation material overlies the blocks of the stack structure. The filled slot structures vertically extend through the isolation material and horizontally intervene between the blocks of the stack structure. The dielectric oxide material horizontally extends substantially continuously over the isolation material and the filled slot structures. A thickness of a portion of the dielectric oxide material within a horizontal area of the crest sub-region of each of the blocks of the stack structure is greater than a thickness of an additional portion of the dielectric oxide material within the array region of each of the blocks of the stack structure.

The structures, devices, system, and methods of the disclosure advantageously facilitate one or more of improved microelectronic device performance, reduced costs (e.g., manufacturing costs, material costs), increased miniaturization of components, and greater packaging density as compared to conventional structures, conventional devices, conventional systems, and conventional methods. The structures, devices, systems, and methods of the disclosure may also improve scalability, efficiency, and simplicity as compared to conventional structures, conventional devices, conventional systems, and conventional methods.

While the disclosure is susceptible to various modifications and alternative forms, specific embodiments have been shown by way of example in the drawings and have been described in detail herein. However, the disclosure is not limited to the particular forms disclosed. Rather, the disclosure is to cover all modifications, equivalents, and alternatives falling within the scope of the following appended claims and their legal equivalents. For example, elements and features disclosed in relation to one embodiment of the disclosure may be combined with elements and features disclosed in relation to other embodiments of the disclosure.

What is claimed is:

1. A microelectronic device, comprising:
a stack structure comprising blocks each including a vertically alternating sequence of conductive material and insulative material arranged in tiers, at least one of the blocks comprising:
 a memory array region having vertically extending strings of memory cells within a horizontal area thereof; and
 a staircase region horizontally neighboring the memory array region and comprising:
  a staircase structure having steps comprising horizontal ends of the tiers; and
  a crest sub-region horizontally interposed between the staircase structure and the memory array region, an uppermost boundary of the tiers within the crest sub-region vertically underlying an uppermost boundary of the tiers within the memory array region;
filled slot structures interposed between the blocks of the stack structure; and
dielectric material substantially continuously horizontally extending over and between the blocks of the stack structure, a vertical thickness of a portion of the dielectric material overlying the crest sub-region of the staircase region of the at least one of the blocks greater than a vertical thickness of an additional portion of the dielectric material overlying the memory array region of the at least one of the blocks.

2. The microelectronic device of claim 1, wherein an upper boundary of a portion of the conductive material of an uppermost one of the tiers within the crest sub-region vertically underlies an upper boundary of an additional portion of the conductive material of the uppermost one of the tiers within the memory array region.

3. The microelectronic device of claim 1, wherein at least one of the filled slot structures comprises:
- dielectric liner material substantially covering and in physical contact with sidewalls of two of the blocks of the stack structure horizontally neighboring one another;
- fill material horizontally surrounded by and in physical contact with the dielectric liner material and having an upper surface below an upper vertical boundary of the at least one of the filled slot structures; and
- a portion of the dielectric material, the portion of the dielectric material vertically overlying and in physical contact with the fill material and horizontally surrounded by and in physical contact with the dielectric liner material.

4. The microelectronic device of claim 3, wherein a vertical offset between the upper surface of the filled material and the upper vertical boundary of the at least one of the filled slot structures is within a range of from about 50 nm to about 300 nm, the vertical offset substantially equal to a vertical height of the portion of the dielectric material.

5. The microelectronic device of claim 1, further comprising an isolation material vertically interposed between the dielectric material and the blocks of the stack structure, the isolation material horizontally neighboring the filled slot structures and substantially covering upper surfaces of the blocks.

6. The microelectronic device of claim 5, wherein a vertical thickness of a portion of the isolation material covering the at least one of the blocks is substantially uniform across the memory array region of the at least one of the blocks and the crest sub-region of the staircase region of the at least one of the blocks.

7. The microelectronic device of claim 1, further comprising additional dielectric material on the dielectric material, the additional dielectric material within a horizontal area of the crest sub-region of the staircase region of the at least one of the blocks but not within a horizontal area of the memory array region of the at least one of the blocks.

8. The microelectronic device of claim 7, wherein an upper surface of the additional dielectric material is substantially coplanar with a portion of an upper surface of the dielectric material within the memory array region of the at least one of the blocks and vertically overlies an additional portion of the upper surface of the dielectric material within the crest sub-region of the staircase region of the at least one of the blocks.

9. The microelectronic device of claim 8, further comprising further dielectric material on the dielectric material and the additional dielectric material, the further dielectric material horizontally extending substantially continuously over the blocks of the stack structure and the filled slot structures and having a substantially planar upper surface.

10. The microelectronic device of claim 9, wherein the further dielectric material has a substantially uniform vertical thickness across the memory array region of the at least one of the blocks is and the crest sub-region of the staircase region of the at least one of the blocks.

11. The microelectronic device of claim 9, wherein:
- the dielectric material comprises a HARP oxide;
- the additional dielectric material comprises a TEOS oxide; and
- the further dielectric material comprises an ALD oxide.

12. The microelectronic device of claim 1, further comprising a source tier vertically underlying blocks of the stack structure and the filled slot structures, the source tier comprising:
- a source structure within a horizontal area of the memory array region of the at least one of the blocks, the source structure in electrical communication with the vertically extending strings of memory cells; and
- discrete conductive structures electrically isolated from the source structure and within a horizontal area of the staircase region of the at least one of the blocks.

13. The microelectronic device of claim 12, further comprising contact structures within the horizontal area of the staircase region of the at least one of the blocks, the contact structures and vertically extending through the tiers and to the discrete conductive structures.

14. A method of forming a microelectronic device, comprising:
- forming a stack structure comprising a vertically alternating sequence of conductive material and insulative material arranged in tiers, the stack structure divided into blocks separated from one another by slots, at least one of the blocks comprising:
  - a memory array region having vertically extending strings of memory cells within a horizontal area thereof; and
  - a staircase region horizontally neighboring the memory array region and comprising a crest sub-region horizontally interposed between a staircase structure and the memory array region, an uppermost boundary of the tiers within the crest sub-region vertically underlying an uppermost boundary of the tiers within the memory array region;
- forming dielectric liner material within the slots, the dielectric liner material substantially covering surfaces of the blocks partially defining horizontal boundaries of the slots;
- forming fill structures within the slots, the fill structures horizontally surrounded by the dielectric liner material and have upper surfaces below upper boundaries of the slots;
- forming dielectric material to horizontally extend substantially continuously over and between the blocks, the dielectric material substantially filling remaining portions of the slots to form filled slot structures; and
- removing an upper portion of the dielectric material, a remaining portion of the dielectric material overlying the crest sub-region of the staircase region of the at least one of the blocks having greater a vertical thickness than an additional remaining portion of the dielectric material overlying the memory array region of the at least one of the blocks.

15. The method of claim 14, wherein forming fill structures within the slots comprises:
- forming additional liner material inside and outside of the slots, the additional liner material substantially covering exposed surfaces of the dielectric liner material and only partially filling portions of the slots remaining unfilled by the dielectric liner material;
- removing portions of the additional liner material outside of the slots as well as additional portions of the additional liner material within the slots and proximate the upper boundaries of the slots to form liner structures within the slots;

forming a fill material inside and outside of the slots, the fill material substantially filling regions of the slots remaining unfilled by the dielectric liner material and the liner structures; and removing portions of the fill material outside of the slots as well as portions of the liner structures and additional portions of the fill material within the slots and proximate the upper boundaries of the slots to form the fill structures, the fill structures comprising remaining portions of the liner structures and the fill material.

16. The method of claim 15, further comprising:
selecting the dielectric liner material to comprise dielectric oxide material;
selecting the additional liner material to comprise polycrystalline silicon; and
selecting the fill material to comprise additional polycrystalline silicon.

17. The method of claim 15, wherein removing additional portions of the additional liner material within the slots and proximate the upper boundaries of the slots comprises recessing regions of the additional liner material proximate the upper boundaries of the slots such that the regions of the slots remaining unfilled by the dielectric liner material and the liner structures have relatively greater horizontal dimensions proximate the upper boundaries of the slots.

18. The method of claim 15, wherein removing portions of the liner structures and additional portions of the fill material within the slots and proximate the upper boundaries of the slots comprises forming the upper surfaces of the fill structures to offset from the upper boundaries of the slots by a vertical height within a range of from about 50 nm to about 300 nm.

19. The method of claim 14, further comprising forming an additional dielectric material over the dielectric material prior to removing the upper portion of the dielectric material.

20. The method of claim 19, wherein removing the upper portion of the dielectric material comprises also removing an upper portion of the additional dielectric material, an upper surface of a remaining portion of the additional dielectric material overlying the crest sub-region of the staircase region of the at least one of the blocks substantially coplanar with an upper surface of the additional remaining portion of the dielectric material overlying the memory array region of the at least one of the blocks.

21. The method of claim 20, further comprising forming a further dielectric material on the upper surface of the remaining portion of the additional dielectric material and on the upper surface of the additional remaining portion of the dielectric material.

22. The method of claim 14, further comprising forming an isolation material to vertically overlie the blocks of the stack structure prior to forming the dielectric liner material within the slots, the isolation material partially defining the upper boundaries of the slots and the horizontal boundaries of the slots.

23. A memory device, comprising:
a stack structure comprising blocks including tiers each comprising conductive material vertically adjacent insulative material, each of the blocks comprising:
a memory array region including strings of memory cells vertically extending through some of the tiers;
a staircase region neighboring the memory array region in a first horizontal direction and comprising:
a staircase structure having steps comprising edges of the tiers; and
an elevated sub-region interposed between a top of the staircase structure and the memory array region in the first horizontal direction, a portion of an upper surface of uppermost one of the tiers within the memory array region vertically overlying an additional portion of the upper surface of the uppermost one of the tiers within the elevated sub-region;
filled slot structures interposed between the blocks of the stack structure in a second horizontal direction orthogonal to the first horizontal direction;
a first dielectric material substantially continuously horizontally extending over and between the blocks of the stack structure, a vertical height of a first portion of the first dielectric material within a horizontal area of the elevated sub-region of the staircase region of each of the blocks greater than a vertical height of a second portion of the first dielectric material within a horizontal area of the memory array region of each of the blocks; and
a second dielectric material on the first portion of the first dielectric material, an upper boundary of the second dielectric material substantially coplanar with an upper boundary of the second portion of the first dielectric material.

24. The memory device of claim 23, further comprising an isolation material vertically interposed between the blocks of the stack structure and each of first dielectric material and the second dielectric material, the isolation material horizontally from and between the filled slot structures.

25. The memory device of claim 24, wherein each of the filled slot structures comprises:
dielectric oxide liner substantially covering and in physical contact with opposing sidewalls of neighboring pairs of the blocks of the stack structure;
fill material horizontally surrounded by the dielectric oxide liner and having upper vertical boundary underlying upper vertical boundaries of the filled slot structures; and
a portion of the first dielectric material, the portion of the first dielectric material on the fill material and horizontally surrounded by the dielectric oxide liner.

26. The memory device of claim 23, further comprising a third dielectric material on surfaces of the first dielectric material and the second dielectric material, the third dielectric material having a substantially planar upper boundary.

27. The memory device of claim 23, further comprising:
digit lines overlying the stack structure and in electrical communication with the strings of memory cells;
a source structure underlying the stack structure and in electrical communication with the strings of memory cells;
conductive routing structures in electrical communication with the conductive material of at least some of the tiers of the stack structure; and
control logic circuitry underlying the stack structure and coupled to the source structure, the digit lines, and the conductive routing structures.

28. An electronic system, comprising:
an input device;
an output device;
a processor device operably coupled to the input device and the output device; and
a memory device operably coupled to the processor device and comprising at least one microelectronic device structure comprising:

a stack structure comprising blocks including tiers each comprising conductive material vertically adjacent insulative material, each of the blocks comprising:
    an array region including vertically extending strings of memory cells; and
    a staircase region neighboring the array region and comprising a crest sub-region horizontally interposed between a staircase structure and the array region, an upper boundary of an uppermost one the tiers within the crest sub-region below an upper boundary of the uppermost one the tiers within the array region;
isolation material overlying the blocks of the stack structure;
filled slot structures vertically extending through the isolation material and horizontally intervening between the blocks of the stack structure; and
dielectric oxide material horizontally extending substantially continuously over the isolation material and the filled slot structures, a thickness of a portion of the dielectric oxide material within a horizontal area of the crest sub-region of each of the blocks of the stack structure greater than a thickness of an additional portion of the dielectric oxide material within the array region of each of the blocks of the stack structure.

* * * * *